United States Patent
Luby et al.

(10) Patent No.: US 7,676,735 B2
(45) Date of Patent: Mar. 9, 2010

(54) FORWARD ERROR-CORRECTING (FEC) CODING AND STREAMING

(75) Inventors: Michael G. Luby, Berkeley, CA (US); Mark Watson, San Francisco, CA (US); M. Amin Shokrollahi, San Jose, CA (US)

(73) Assignee: Digital Fountain Inc., San Diego, CA (US)

( * ) Notice: Subject to any disclaimer, the term of this patent is extended or adjusted under 35 U.S.C. 154(b) by 379 days.

(21) Appl. No.: 11/423,391

(22) Filed: Jun. 9, 2006

(65) Prior Publication Data

US 2006/0279437 A1   Dec. 14, 2006

Related U.S. Application Data

(60) Provisional application No. 60/689,333, filed on Jun. 10, 2005.

(51) Int. Cl.
 *H03M 13/00* (2006.01)
(52) U.S. Cl. .................... 714/781; 714/755
(58) Field of Classification Search .......... 714/710, 714/752, 786, 781, 755
 See application file for complete search history.

(56) References Cited

U.S. PATENT DOCUMENTS

| | | | |
|---|---|---|---|
| 5,136,592 A | | 8/1992 | Weng |
| 5,331,320 A | * | 7/1994 | Cideciyan et al. .......... 341/56 |
| 5,608,738 A | * | 3/1997 | Matsushita ............. 714/752 |
| 5,983,383 A | * | 11/1999 | Wolf ..................... 714/755 |
| 6,307,487 B1 | | 10/2001 | Luby |
| 6,694,476 B1 | * | 2/2004 | Sridharan et al. .......... 714/781 |
| 6,810,499 B2 | * | 10/2004 | Sridharan et al. .......... 714/755 |
| 6,831,172 B1 | | 12/2004 | Shokrollahl et al. |
| 7,068,729 B2 | | 6/2006 | Shokrollahi et al. |

OTHER PUBLICATIONS

PCT Search Report for PCT Appln No. PCT/US06/22913 mailed Jul. 18, 2008 (3 pages).
Rizzo, L.,: "Effective Erasure Codes for Reliable Computer CommuniOation Protocols," Computer Communication . Review, 27 (2), pp, 24-36 (Apr. 1997).
Bloemer, J. et al.: "An XOR-Based Erasure-Resilient Coding Scheme," Technical Report TR-95,48, International Computer Science Institute, Berkeley, California (1995).
International Switzerland, Preliminary .Report on Patentability, PCT/US2006/022913 - The International Bureau of WIPO - Geneva, Aug. 26, 2008.
Written Opinion, PCT/US2006/022913 - Intemational Search Authority - US, Jul. 18, 2008.

* cited by examiner

*Primary Examiner*—Esaw T Abraham
(74) *Attorney, Agent, or Firm*—Jeffrey D. Jacobs

(57) ABSTRACT

In a data decoder for decoding data from received symbols received over a channel from an encoder, a method for decoding data wherein the received data includes erasures and includes source symbols and repair symbols organized into one or more source blocks. The decoder uses a generator matrix, any square submatrix of which is invertible, such that the decoder performs decoding operations concurrently with the arrival of the source symbols and repair symbols that are a part of a source block. Novel methods for interleaving and specifying encoding structure for a large class of FEC codes, scheduling the sending of packets and the like, are also applied in conjunction with the method for decoding data.

10 Claims, 13 Drawing Sheets

|  | Current block | | | |
|---|---|---|---|---|
|  | Time interval | Duration | Receive | Send |
| Source Initial Process | $0 \ldots T'$ | $T'$ | source | X |
| Source Mid Process | $T' \ldots T$ | $T - T'$ | source | source |
| Source Final Process | $T \ldots T' + T/(1+p)$ | $T' - u \cdot T$ | X | source |
| Repair Send Process | $T' + T/(1+p) \ldots T' + T$ | $u \cdot T$ | X | repair |

FIGURE 8A

| Previous Block | | | | | |
|---|---|---|---|---|---|
| Source Initial Process | Receive source | | | | |
| Source Initial Process | Receive source | | | | |
| Source Mid Process | Receive source Send source | Current Block | | | |
| Source Final Process | Send source | Source Initial Process | Receive source | | |
| Repair Send Process | Send repair | Source Initial Process | Receive source | | |
|  |  | Source Mid Process | Receive source Send source | Next Block | |
|  |  | Source Final Process | Send source | Source Initial Process | Receive source |
|  |  | Repair Send Process | Send repair | Source Initial Process | Receive source |
|  |  |  |  | Source Mid Process | Receive source Send source |
|  |  |  |  | Source Final Process | Send source |
|  |  |  |  | Repair Send Process | Send repair |

FIGURE 8B

FORWARD ERROR-CORRECTING (FEC) CODING AND STREAMING

CROSS-REFERENCES TO RELATED APPLICATIONS

This application claims the benefit of and is a non-provisional of U.S. Patent Application Ser. No. 60/689,333 filed on Jun. 10, 2005, which is incorporated by reference in its entirety for all purposes.

FIELD OF THE INVENTION

The present invention relates to FEC coding in general and in particular to FEC coding for streaming applications.

BACKGROUND OF THE INVENTION

Recently, it has become common practice to consider using FEC codes for protection of streaming media during transmission. When sent over a packet network, examples of which include the Internet and wireless networks such as those standardized by groups such as 3GPP, 3GPP2 and DVB, the source stream is placed into packets as it is generated or made available, and thus the packets are used to carry the source stream in the order it is generated or made available to receivers. In a typical application of FEC codes to these types of scenarios, the FEC code is used to add additional repair packets to the original source packets containing the source stream, and these repair packets have the property that when source packet loss occurs received repair packets can be used to recover the data contained in the lost source packets. In other examples, it is possible that partial packet loss occurs, i.e., receivers may lose parts of a packet while receiving other parts of that packet, and thus in these examples wholly or partially received repair packets can be used to recover wholly or partially lost source packets. In yet other examples, other types of corruption can occur to the sent data, e.g., values of bits may be flipped, and thus repair packets may be used to correct such corruption and provide as accurate as possible recovery of the source packets. In other examples, the source stream is not necessarily sent in discrete packets, but instead may be sent for example as a continuous bitstream.

There are many examples of FEC codes that can be used to provide protection of a source stream. Reed-Solomon codes are well known codes for error and erasure correction in communication systems. For erasure correction over, for example, packet data networks, a well-known efficient implementation of Reed-Solomon codes is to use Cauchy or Vandermonde matrices as described in L. Rizzo, "Effective Erasure Codes for Reliable Computer Communication Protocols", Computer Communication Review, 27(2):24-36 (April 1997) (hereinafter "Rizzo") and Bloemer, ET AL., "An XOR-Based Erasure-Resilient Coding Scheme", Technical Report TR-95-48, International Computer Science Institute, Berkeley, Calif. (1995) (hereinafter "XOR-Reed-Solomon"). Other examples of FEC codes include LDPC codes, chain reaction codes and multi-stage chain reaction codes, such as those described in U.S. Pat. No. 6,307,487 (hereinafter "Luby I") and U.S. Published Patent App. No. 2003/0058958 (hereinafter "Shokrollahi I"), respectively, which are incorporated herein for all purposes.

Examples of the FEC decoding process for variants of Reed-Solomon codes are described in "Rizzo" and "XOR-Reed-Solomon". In these examples, decoding is applied once sufficient source and repair data packets have been received. The decoding process may be computationally intensive and, depending on the CPU resources available, this may take considerable time to complete, relative to the length of time spanned by the media in the block. The receiver must take into account this length of time required for decoding when calculating the delay required between the start of reception of the media stream and play-out of the media. This delay due to decoding is perceived by the user as a delay between their request for a particular media stream and the start of playback. It is thus desirable to reduce this delay.

In many applications, packets are further sub-divided into symbols on which the FEC process is applied. A symbol can have any size, but often the size of a symbol is at most equal to the size of the packet. Hereinafter, we call the symbols comprising the encoding block the "source symbols," and the symbols generated during the FEC process the "encoding symbols." For some FEC codes, notably Reed-Solomon codes, the encoding and decoding time grows impractical as the number of encoding symbols per source block grows. Thus, in practice, there is often an upper bound, e.g., 255, on the total number of encoding symbols that can be generated per source block. Since symbols are placed into separate packet payloads, this places a practical upper bound on the maximum length on the encoding of a source block, e.g., if a packet payload is at most 1024 bytes, then an encoded source block can be at most 255 KB (kilobytes), and this is also, of course, an upper bound on the size of the source block itself.

Other concerns, such as being able to decode the source blocks fast enough to keep up with the source streaming rate, to minimize the decoding latency introduced by FEC decoding, and to only use a small fraction of the available CPU on the receiving device at any point in time during FEC decoding are issues.

Thus, it is desirable to have improved processes and apparatus.

BRIEF SUMMARY OF THE INVENTION

Embodiments of the invention present methods to perform a significant portion of the calculations associated with decoding concurrently with the reception of packets from an FEC encoded source block. The decoding delay, i.e., the delay after receipt of the last packet for a source block before the recovered source block is available, is therefore reduced to that required to perform the remaining portion of the calculations, which is in general a small fraction of the total decoding work.

In some embodiments, a data decoder for decoding data from symbols received over a channel from an encoder is used, wherein the received data can include erasures and include source symbols and repair symbols and wherein the decoder uses in decoding a generator matrix, any square submatrix of which is invertible, such that the decoder can perform decoding operations concurrently with the arrival of the source symbols and repair symbols, and a method of decoding comprising representing in decoder memory a system of equations derived, at least in part, from the generator matrix, substituting received source symbols into the system of equations as the source symbols are received before receiving all source symbols, identifying, using decoder logic, repair equations to be used for solving the system of equations as repair symbols arrive, calculating, using decoder logic, vector values for equations as source symbols arrive, and converting the system of equations into an upper triangular form as repair symbols arrive at the decoder are provided.

In some embodiments, novel methods are used for interleaving 2D Reed-Solomon codes and other related codes to obtain advantages. Some embodiments might use a novel general succinct mechanism for specifying encoding structure for a large class of FEC codes.

Embodiments also present novel methods to schedule the sending of packets for the source blocks. Some of the benefits of this method include the minimization of FEC end-to-end latency, the minimization of FEC receiver latency, the transmission of the FEC encoded stream at as smooth of a rate as possible, spreading data sent in packets for a source block as uniformly across time as possible, and simple logic requirements at the FEC receiver.

Embodiments also present novel methods of interleaving source blocks. This permits losses or errors in transmission within individual source blocks to be spread out over a much larger period of time than if interleaving were not used, and allows the decoding latency perceived by the receiver to be reduced to a minimum while also maintaining the original sending order of source data.

The following detailed description together with the accompanying drawings will provide a better understanding of the nature and advantages of the present invention.

BRIEF DESCRIPTION OF THE DRAWINGS

FIG. 8A shows the different phases of processing of a source block.

FIG. 8B shows the relationship between the different phases of processing of consecutive source blocks.

DETAILED DESCRIPTION OF THE INVENTION

Embodiments described herein provide for novel methods to perform decoding of data received over a network or the like, such as decoding concurrently with the reception of packets from an FEC encoded source block to reduce decoding delay. Hereafter, the network carrying data is assumed to be packet-based in order to simplify the descriptions herein, with the recognition that one skilled in the art can easily see how the processes and methods described herein can be applied to other types of transmission networks such as continuous bit-stream networks. Hereafter the FEC codes are assumed to provide protection against lost packets or lost partial data within packets in order to simplify the descriptions herein, with the recognition that one skilled in the art can easily see how the processes and methods described herein can be applied to other types of data transmission corruption such as bit-flips.

Figure 1:
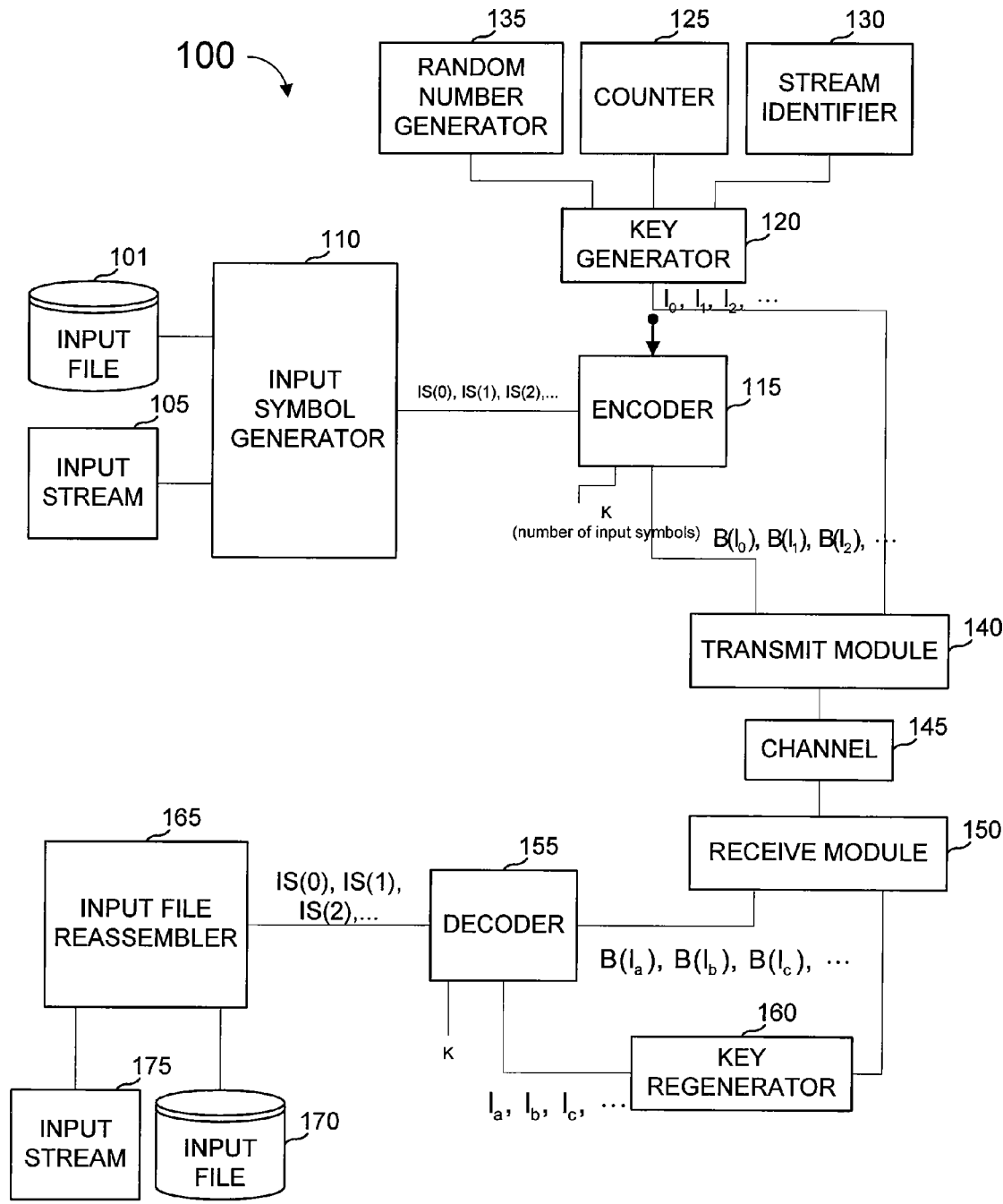
FIG. 1 is a block diagram of a communications system according to one embodiment of the present invention.

FIG. 1 is a block diagram of a communications system 100 that uses chain reaction coding. In communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 1 as a parenthesized integer). The possible values for input symbols, i.e., its alphabet, is typically an alphabet of $2^M$ symbols, so that each input symbol codes for M bits of the input file. The value of M is generally determined by the use of communication system 100, but a general purpose system might include a symbol size input for input symbol generator 110 so that M can be varied from use to use. The output of input symbol generator 110 is provided to an encoder 115.

Key generator 120 generates a key for each output symbol to be generated by the encoder 115. Each key can be generated according to one of the methods described in Luby I or in Shokrollahi I, or any comparable method that insures that a large fraction of the keys generated for the same input file or block of data in a stream are unique, whether they are generated by this or another key generator. For example, key generator 120 may use a combination of the output of a counter 125, a unique stream identifier 130, and/or the output of a random generator 135 to produce each key. The output of key generator 120 is provided to encoder 115. In other examples, for example some streaming applications, the set of keys may be fixed and reused again for each block of data in a stream. In a typical embodiment, the number of keys that can be generated is dictated by a resolution of a key generator rather than the size or other characteristic of the input file or stream. For example, if the input is expected to be on the order of ten thousand symbols or less, a key resolution might be 32-bits, allowing for up to 4 billion unique keys. One result of these relative numbers is that an encoder that encodes according to the keys might be capable of generating 4 billion unique output symbols for ten thousand symbols of input. As a practical matter, most communication systems will not lose all but one of 400,000 symbols, so nowhere near 4 billion output symbols will need to be generated and therefore, the number of possible keys can be treated as being effectively unlimited and would not have to be repeated and the probability of two independent selections of keys would grab the same key is vanishingly small. However, if that were the case for some reason, the resolution of the key generator can be increased so that the processes that use the keys can behave as if there were an endless supply of keys.

From each key I provided by key generator 120, encoder 115 generates an output symbol, with a value B(I), from the input symbols provided by the input symbol generator. The value of each output symbol is generated based on its key and on some function of one or more of the input symbols, referred to herein as the output symbol's "associated input symbols" or just its "associates". Typically, but not always, M is the same for input symbols and output symbols, i.e., they both code for the same number of bits.

In some embodiments, the number K of input symbols is used by the encoder to select the associates. If K is not known in advance, such as where the input is a stream and K can vary between each block in the stream, K can be just an estimate. The value K might also be used by encoder 115 to allocate storage for input symbols.

Encoder 115 provides output symbols to a transmit module 140. Transmit module 140 is also provided the key of each such output symbol from the key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

Channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Where channel 145 comprises a packet network, communications system 100 might not be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a key regenerator 160. Key regenerator 160 regenerates the keys for the received output symbols and provides these keys to decoder 155. Decoder 155 uses the keys provided by key regenerator 160 together with the corresponding output symbols, to recover the input symbols (again IS(0), IS(1), IS(2), . . . ). Decoder 155 provides the recovered input symbols to an input file reassembler 165, which generates a copy 170 of input file 101 or a copy 175 of input stream 105.

Media Streaming Applications

When used in media streaming applications, source packets forming the source media stream are sometimes collected in groups called source blocks. For example a source block could be a group of source packets spanning a fixed length of time, and for example a Reed-Solomon erasure code could be applied independently to these source blocks to generate repair packets which are sent, together with the original source packets of the source block, to receivers.

At the sender, the source stream is continuously partitioned into source blocks as source packets arrive, and then repair packets are generated for each source block and sent. It is preferable to minimize the total end-to-end delay added by the use of FEC codes, especially for live or interactive streaming applications, and thus it is preferable if the overall design of the FEC solution is such that source packets are delayed as little as possible at the sender before being sent, and all source and repair packets for a source block are sent with as little total delay as possible. It is also preferable if the rate of the FEC encoded stream is as smooth as possible, i.e., there is as little variability as possible in the FEC encoded stream rate or at least there is no amplification of any variability that already exists in the original source stream, because this makes the FEC encoded stream bandwidth usage more predictable and minimizes the impact on the network and on other possibly competing streams. It is also preferable if the data sent in packets for a source block is spread as uniformly as possible over the period when packets are sent for that source block, since this provides the best protection against burst losses. It is also preferable if the FEC logic at the receiver is as simple as possible, i.e., avoids as much as possible concurrent reception of packets from multiple source blocks. Thus, it is preferable if the FEC sender as much as possible sends all packets from one source block before sending any from a subsequent source block.

At the receiver, if packets are lost or received with errors (which can be detected and discarded, for example, using CRC checks), then, assuming sufficient repair packets have been received, the repair packets may be used to recover the lost source packets.

In some applications, packets are further sub-divided into symbols on which the FEC process is applied. For some FEC codes, notably Reed-Solomon codes, the encoding and decoding time grows impractical as the number of encoding symbols per source block grows and there is often an upper bound on the total number of encoding symbols that can be generated per source block. Since symbols are placed into different packet payloads, this places a practical upper bound on the maximum length on the encoding of a source block and this is also, of course, places an upper bound on the size of the source block itself.

For many applications, when protection is to be provided over a long period of time or when the media streaming rate is high, it can be advantageous to provide protection over data that exceeds the maximum source block size. In these cases, using source blocks that are shorter than the maximum source block size and then interleaving the source packets from different source blocks provides a solution where the source packets from an individual source block are spread out over larger periods of time.

However, another concern is to be able to decode the source blocks fast enough to keep up with the source streaming rate, to minimize the decoding latency introduced by FEC decoding, and to only use a small fraction of the available CPU on the receiving device at any point in time during FEC decoding. Furthermore, it is important not to change the original sending order of the source packets. Thus, it is desirable to use a source block interleaving that respects the original sending order of source packets and allows the FEC decoding of each source block to be spread out as equally as possible over time and minimizes FEC decoding latency. Various embodiments described herein provide one or more of these advantages.

Terminology

FEC Codes

In this description, we assume that the data to be encoded (source data) has been broken into equal length "symbols", which can be of any length (down to a single bit). Symbols can be carried over the data network in packets, with a whole number of symbols explicitly carried or implied in each packet. In some cases, it is possible that a source packet is not a multiple of the symbol length, in which case the last symbol in the packet may be truncated. In this case, for the purposes of FEC coding, this last symbol is implicitly assumed to be padded out with a fixed pattern of bits, e.g., zero-valued bits, so that even though these bits are not carried in the packet the receiver can still fill this last truncated symbol out to a full symbol. In other embodiments, the fixed pattern of bits can be placed into the packet, thereby effectively padding the symbols to a length equal to that of the packet. The size of a symbol can often be measured in bits, where a symbol has the size of M bits and the symbol is selected from an alphabet of $2^M$ symbols. Nonbinary digits are also contemplated, but binary bits are preferred as they are more commonly used.

The FEC codes we consider for streaming herein are typically systematic FEC codes, i.e., the source symbols of the source block are included as part of the encoding of the source block and thus the source symbols are transmitted. A systematic FEC code then generates from a source block of source symbols some number of repair symbols, and then the combination of the source and repair symbols are the encoding symbols that are sent for the source block. Some of the FEC codes have the ability to efficiently generate as many repair symbols as needed. Such codes are referred to as "information additive codes" and as "fountain codes" and examples of these codes include "chain reaction codes" and "multi-stage chain reaction codes." Other FEC codes such as Reed-Solomon codes can practically only generate a limited number of repair symbols.

There are many other methods for carrying symbols within packets, and although the descriptions below use this example for simplicity it is not meant to be limiting or comprehensive. In the context of the descriptions below, the term "packet" is not meant to be constrained to mean literally what is sent as a single unit of data. Instead, it is meant to include the broader notion of defining a logical grouping of symbols and partial symbols that may or may not be sent as a single unit of data.

There are also forms of corruption of data other than loss of symbols, e.g., symbols that in transmission change their value or are corrupted in other ways, to which the methods described below apply equally. Thus, although the descriptions below will often describe the loss of symbols, the methods apply equally well to other types of corruption and to other types of FEC codes beyond FEC erasure codes, such as FEC error-correcting codes.

Linear Transformations

To illustrate certain constructs and examples, we will make use of the mathematical concept of a ring. As is well-known to those of skill in the art, a ring is a set on which two operations, addition and multiplication, are defined such that these operations satisfy the distributive laws. Moreover, the set considered with addition alone forms an abelian group, i.e., the result of an addition is independent of the ordering of the summands, there is a neutral element 0 for addition, and for each element there is another element such that the sum of these elements is 0. The other requirement is that the multiplication has a neutral element 1, such that multiplication of any element with 1 does not change the value of that element. For a general ring, we do not require that any nonzero element has a multiplicative inverse, nor do we require that multiplication is commutative. When both these conditions are satisfied, however, then we call the ring a "field." This notation is a standard one in the area of algebra.

A mapping is a logical construct implementable in hardware, software, data storage, etc., that maps pairs of symbols of the same size to another symbol of that size. We denote this mapping by "$\oplus$", and the image of this map on the pair (S,T) of symbols by S$\oplus$T. An example of such a mapping is the bit-wise exclusive-or (XOR).

Another concept that is used herein is that of the "action" of a special type of sets on symbols. Suppose that A is a set equipped with a commutative addition operation ("+") that has a neutral element and that, for every element, contains its additive inverse. Such a set is also commonly called an abelian group. An "action" of this group on the set of symbols is a mapping that maps a pair consisting of a group element r and a symbol S to another symbol. We denote the image by r*S. Where this mapping respects addition in the group, i.e., for every pair of elements a and b in the group A, we have (a+b)*S=a*S$\oplus$b*S. If A is a ring and the action also respects multiplication in A, where the multiplication operator in A is "·", i.e., (a·b)*S=a*(b*S), then this action is called an "operation."

Examples of rings or fields operating on symbols are abundant. A few examples are mentioned below. This list of examples is meant for illustrative purposes only, and should not be considered an exhaustive list, nor should it be construed to limit the scope of this invention.

As an example, the field GF(2) consisting of 0 and 1, with addition being exclusive-or (XOR) and multiplication being the logical operation AND, operates on the set of symbols by defining 1*S=S, and 0*S=0, wherein S denotes an arbitrary symbol and 0 denotes the symbol consisting entirely of zeros.

The concept of a "linear transformation" and the matrix formulation of this process can be defined with reference to the concept of an operation of a ring on symbols. For given integers k and n, a linear transformation induced by the operation maps vectors of k symbols into vectors of n symbols using the space of matrices with entries in the specified ring. A matrix over the ring R is a 2-dimensional collection of entries, wherein each entry belongs to R. If a matrix has n rows and k columns, then it is commonly referred to as an n×k matrix. The pair (n,k) is called the "format" of the matrix. Matrices of the same format can be added and subtracted, using the addition and subtraction in the underlying field or ring. A matrix of format (n,k) can be multiplied with a matrix of format (k,m), as is commonly known.

In operation, if M denotes such an n×k matrix, and M[i,j] denotes the entry of M at position (i,j), and if this matrix transforms the vector $(S_1, S_2, \ldots, S_k)$ into the vector $(E_1, E_2, \ldots, E_n)$, then the relationship shown in Equation 1 is valid.

$$\text{for all i from 1 to n, } E_j = M[i,1]*S_1 \oplus M[i,2]*S_2 \oplus \ldots \oplus M[i,k]*S_k \quad \text{(Equ. 1)}$$

If S denotes the column vector comprising $S_1, S_2, \ldots, S_k$, and E denotes the column vector of the symbols $E_1, E_2, \ldots, E_n$, then E=M*S.

Such linear transformations are commonplace in a variety of applications. For example, when using a linear FEC code to encode a source block, S could be the source symbols of the source block to be encoded, E could be the encoding symbols generated from S to be sent for the source block, and M could be a generator matrix for the FEC code. In other applications, for example where a systematic FEC code is used, E could be the repair symbols generated from S, while M could be the matrix describing the dependency of the repair symbols on the source symbols. In yet other applications, S could be a vector of encoding symbols received after transmission, and E could correspond to a set of source symbols that are either completely or partially unknown, and M could describe the relationship between E and S. These examples include the case when decoding Reed-Solomon codes in face of erasure, or in face of errors. The latter is described in U.S. Pat. No. 6,631,172 entitled "Efficient List Decoding of Reed-Solomon Codes for Message Recovery in the Presence of High Noise Levels," to Shokrollahi et al.

The matrix formulation of systematic Reed-Solomon codes represents a set of simultaneous equations which hold amongst the source and repair symbols. Specifically, each equation expresses encoding symbols as a linear combination of the source symbols, in the case of repair symbols, and as an identity equation, in the case of source symbols. So, there is exactly the same number of equations as there are source and repair symbols.

The method and processes described herein apply equally to other formulations of Reed-Solomon codes or other FEC erasure codes or FEC error-correcting codes.

Streaming

For the purposes of providing FEC protection of a source stream, the source stream may be a combination of one or more logical streams, examples of which are a combination of an audio RTP stream and a video RTP stream, a combination of a MIKEY stream and an RTP stream, a combination of two or more video streams, and a combination of control RTCP traffic and an RTP stream. As the source stream arrives at the FEC sender, in a format that for example is a source bit stream, a source symbol stream, or a source packet stream, the FEC sender may buffer the stream into source blocks and generate a repair stream from the source blocks. The FEC sender schedules and sends the source stream and the repair stream, for example, in packets to be sent over a packet network. The FEC encoded stream is the combined source and repair stream. The FEC receiver receives the FEC encoded stream, which may have been corrupted, for example, due to losses or bit-flips. The FEC receiver attempts to reconstruct the original source blocks of the source stream and schedules and makes available the original source stream at the receiver.

For a streaming application, there are several key parameters that are inputs to the design of how to use FEC codes to protect the source stream and several key metrics that are typically of importance to optimize.

Two key input parameters in the design are the protection period and the protection amount. The sender protection period for a source block is the duration of time over which symbols generated from that source block are sent. The protection amount for a source block is the number of FEC repair symbols sent for the source block, expressed as a fraction or a percentage of the number of source symbols in the source block. For example, if the protection period is 2 seconds and the protection amount is 20% and there are 10,000 source symbols in the source block, then the 10,000 source symbols and the 2,000 repair symbols for the source block are sent spread over a 2 second window of time.

Both the protection period and the protection amount per source block can vary from one source block to the next. For example, when a source block preferably does not span between certain source packets in a source stream, e.g., when a first packet is the last packet of a Group of Pictures (GOP) in a MPEG2 video stream and a second consecutive packet is the first packet of a next GOP, then a source block might be terminated after the first packet and before the second packet even if this occurs before the end of a protection period. This allows the FEC protection block to be aligned with the video coding block, which can have many advantages, including the advantage that receiver latency due to video buffering and FEC buffering can be minimized. In other applications, it can be advantageous for a variety of reasons to always maintain the same protection period and/or source block size for each consecutive source block. In many of the descriptions below for simplicity both the protection period and protection amount are assumed to be the same for each subsequent source block. For those skilled in the art, it should be clear after reading this disclosure that this is not limiting, as one can easily determine upon reading this disclosure how the processes and methods described herein also apply when either the protection amount or protection period or both vary from one source block to the next, and when source block sizes vary from one to the next.

To simplify some of the subsequent discussions, it is often assumed that source symbols of the original stream arrive at a FEC sender that is to perform FEC encoding at a steady rate, and that once the FEC receiver first makes source symbols available at the receiver, then subsequent source symbols are made available by the FEC receiver at the same steady rate, assuming that in the first source block from which a source symbol is received there is no source symbol loss and that in each subsequent source block the encoding symbol loss is at most the maximum possible to allow successful FEC decoding. This simplifying assumption is not inherent in the operation or design of the processes and methods described subsequently and is not meant to be limiting these processes to this assumption in any way, but is introduced merely as a tool to simplify some of the descriptions of the properties of the processes and methods. For example, for variable rate streams the corresponding condition is that the source symbols are made available by the FEC receiver at the same or close to the same rate as they arrive at the FEC sender.

Some key metrics of importance to minimize include the FEC sender latency, which is the latency introduced by the FEC sender. Minimizing the FEC sender latency is desirable for some applications such as live video streaming or interactive applications such as video conferencing. One aspect of an overall design that helps to minimize the FEC sender latency is for the FEC sender to send source symbols in the same order as they arrive at the FEC sender. Other design aspects that minimize the FEC sender latency are described later.

Figure 2:
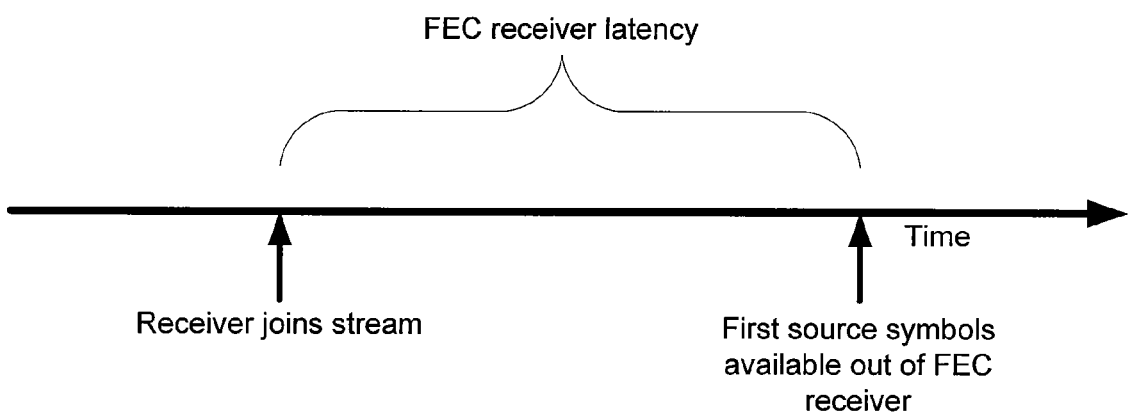
FIG. 2 is a diagram illustrating receiver latency.

Another important metric is the FEC receiver latency. As shown in FIG. 2, this is the time between when the receiver joins or requests the stream and first starts receiving encoding symbols from the stream until the time when the FEC receiver first makes available source symbols from the stream. In general, it is desirable to minimize the FEC receiver latency, since this minimizes the memory requirements at the receiver for storing symbols before they are decoded and passed along by the FEC receiver, and this also minimizes the amount of time between when a stream is joined and when the stream first starts becoming available, for example for playback of a video stream. One important aspect of minimizing the FEC receiver latency is for the FEC sender to maintain the original sending order of the source symbols, but as we describe below there are many other important design aspects that have a large impact on the FEC receiver latency.

Figure 3A:
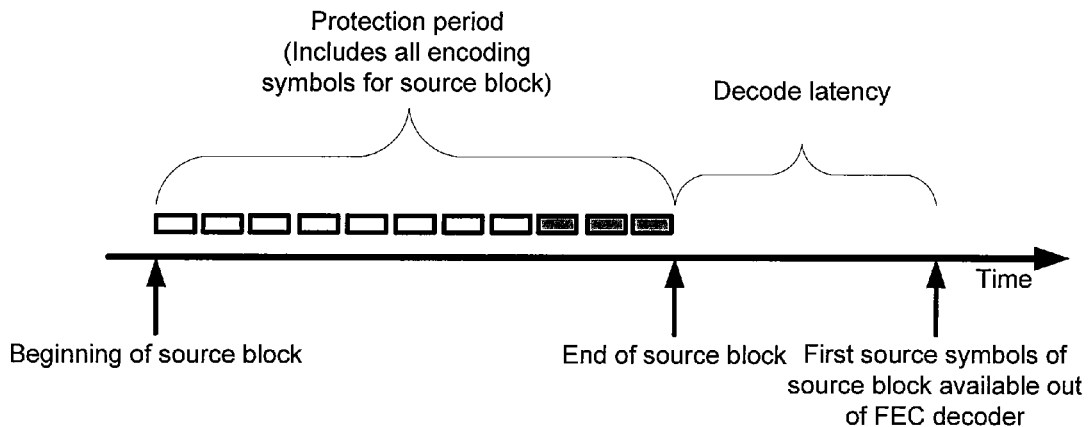
FIG. 3A is a drawing exemplifying components of receiver latency.
Figure 3B:
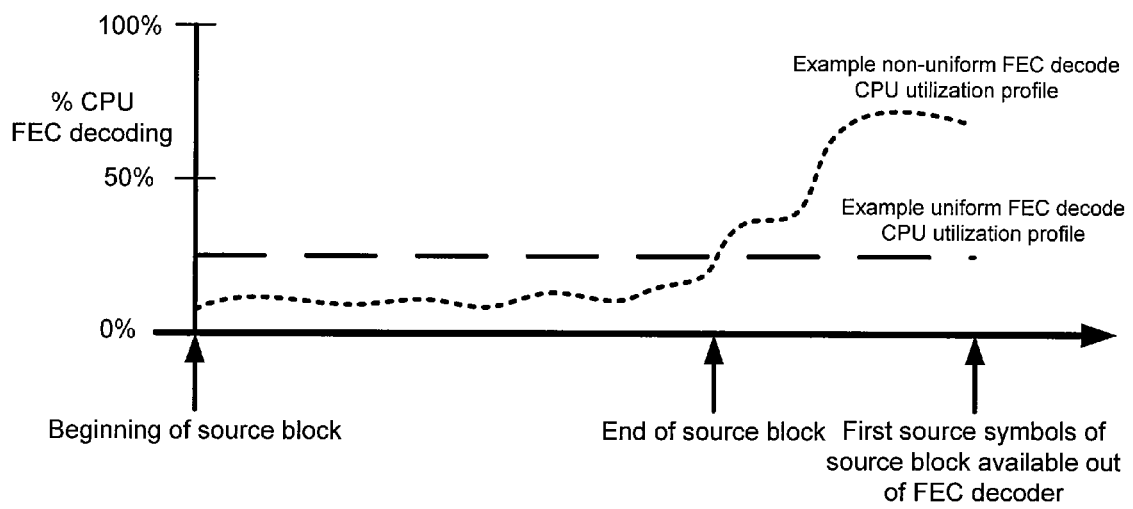
FIG. 3B is a drawing exemplifying CPU utilization for FEC during decoding.

The FEC receiver latency typically comprises multiple components. An example of these components for a stream that is partitioned into sequential source blocks is shown in FIGS. 3A and 3B. FIG. 3A shows a single source block per protection period, and the example shows the case where the receiver joins the stream at the beginning of the source block. The two components of the FEC receiver latency in this example are the protection period and the decode latency. The receiver protection period is the time during which the FEC receiver is buffering received encoding symbols from the source block. Note that the sender protection period and the receiver protection period are the same if the channel between the sender and receiver does not have any variation in terms of the amount of time it takes each bit, byte, symbol or packet to travel from the sender to the receiver. Thus, in practice the sender protection period may differ from the receiver protection period for the same source block due to network timing variations in delivery.

To simplify the illustrations here, we hereafter assume that the sender protection period and the receiver protection period are the same for each source block, and we use the term "protection period" synonymously for sender protection period and receiver protection period, i.e., we assume that the network delivery time is the same for all data, and we note that one skilled in the art can, after reading this disclosure, make the necessary changes to the methods and apparatus described herein to take into account differences in sender and receiver protection periods due to network delivery fluctuations.

The protection period component of the FEC receiver latency is inevitable, because even if in the first source block there is no loss of any source symbols, one still has to delay making the source symbols available for at least the protection period in order to ensure smooth source symbol delivery of all subsequent source symbols when there is loss of encoding symbols in subsequent source blocks. During the protection period some or most or all of the FEC decoding of the source block can be occurring concurrently with the reception of encoding symbols. At the end of the protection period, there may be additional FEC decoding that occurs before the first source symbol of the source block is available from the FEC receiver, and this period of time is labeled as the decode latency in FIG. 3A. In addition, even after the first source symbol is available there may be additional FEC decoding that occurs before the second and subsequent source symbols of the source block are available. For simplicity, this additional FEC decoding is not shown in FIG. 3A, and it is assumed in this example that there are sufficient available CPU resources to decode all source symbols after the first at a fast enough rate.

FIG. 3B shows two potential FEC decoding CPU utilization curves that could correspond to the example shown in FIG. 3A. In one of the two curves shown in FIG. 3B, the CPU utilization used for FEC decoding is the same at each point in time, i.e., the CPU utilization is uniformly distributed. This is a desirable CPU utilization curve, since it predictably uses the same amount of CPU resources at each point in time, and minimizes the maximum CPU resources assuming that the same amount of total CPU resources are needed to decode the entire source block. In the other of the two curves shown in FIG. 3B, the CPU utilization used for FEC decoding is not the same at each point in time, and in particular the CPU utilization towards and just after the end of the reception of the encoding symbols for the source block is significantly higher than at other points in time. This is not a desirable CPU utilization curve, since the CPU resource usage spikes at certain points in time that might be the points in time when other processes, such as a video player, are also placing demands on the CPU, and thus raising the possibility of causing, for example, a glitch in the playback of a video stream. Thus, the design of an FEC solution for protecting streams is to provide a solution where the FEC decoder uses the CPU as smoothly and uniformly over time as possible. As an example, the design criteria might be that the maximum CPU utilization at any point in time in the FEC decoding process under the worst case pattern of encoding symbol loss is below a certain threshold, e.g., uses at most 10% of the CPU.

When the receiver happens to join the stream in the middle of a source block then the FEC receiver latency can be as small as a protection period plus the decode latency when there is no loss of source symbols from that first partial source block as long as the original sending order of the source packets is maintained by the FEC sender. Thus, it is desirable for the FEC sender to maintain the original sending order of the source symbols.

An FEC streaming solution can also be used to minimize the FEC end-to-end latency, which is the worst-case overall latency introduced by the use of FEC between when a source packet is ready for streaming at the sender before FEC encoding is applied and when it is available for playback at the receiver after FEC decoding has been applied.

An FEC streaming solution can also be used to minimize fluctuations in the sending rate when FEC is used. One benefit of this is that, within packet networks, streams with a fluctuating sending rate are more susceptible to packet loss due to congestion or buffer overflow when peaks in the sending rate of the stream coincide with peaks in other traffic at points in the network with limited capacity. At a minimum, the fluctuations in the rate of the FEC encoded stream should be no worse than the fluctuations in the rate of original source stream, and preferably as more FEC protection is applied to the original source stream the fluctuations in the rate of the FEC encoded stream become smaller. As a special case, if the original stream sends at a constant rate, then the FEC encoded stream should also send at a rate that is as close as possible to a constant.

An FEC streaming solution should provide as simple logic as possible at the FEC receiver. This is important in many contexts because the FEC receiver may be built into a device with limited computational, memory and other resource capabilities. Furthermore, in some cases there may be significant loss or corruption of symbols in transmission, and thus the FEC receiver may have to recover from catastrophic loss or corruption scenarios where when conditions improve there is little or no context to understand where in the stream reception is continuing from. Thus, the simpler and more robust the FEC receiver logic the more quickly and reliably the FEC receiver will be able to start recovering and making available again the source symbols of the source stream from reception of the FEC encoded stream.

Some of the overall desirable features of an FEC streaming solution can be summarized as:

1. The FEC sender should maintain the original sending order of the source stream.
2. The FEC decoder should spread out CPU utilization as smoothly as possible.
3. The FEC receiver should minimize the FEC receiver latency, defined as the delay between the start of reception of the FEC encoded stream and the time when the first data of the source stream is made available after FEC decoding.
4. The FEC sender/receiver should minimize the FEC end-to-end latency, i.e., the total latency introduced by using FEC, which includes the FEC sender latency and the FEC receiver latency.
5. The sending rate of the FEC encoded stream (containing all data sent for the stream) should be as smooth as possible, and should be at least as smooth as the original source stream.

In the next section, we describe methods and apparatus which have some or all of these features.

Incremental Decoding

In this section, we describe an incremental FEC decoding process that recovers lost source symbols for a source block from received encoding symbols for that source block. In this description, we assume that a systematic FEC code is used, where the symbols generated from a source block of source symbols are called repair symbols and the term "encoding symbol" is used to refer to a symbol that is either a source symbol or a repair symbol.

The process updates concurrently with the reception of encoding symbols a list of linear equations in which the number of equations is the number of encoding symbols received, and the number variables is the number of source symbols. Each equation corresponds to one of the encoding symbols received. At the beginning of the process the number of equations is zero, echoing the fact that no encoding symbols have yet been received.

We describe a technique for partially completing the decoding operation concurrently with receipt of the source and repair symbols. The technique is described by way of example in terms of systematic Reed-Solomon codes based on Vandermonde or Cauchy matrices, but could equally be applied to any linear transformation described in terms of matrices.

An (n, k) Reed-Solomon codes based on Vandermonde or Cauchy matrices operates as follows:

An n×k generator matrix over $GF(2^q)$, M, is constructed such that Equation 2 below is satisfied, where E is the column vector of size n comprising encoding symbols and S is the column vector of size k comprising the source symbols. For a systematic code, we additionally assume that the first k rows of M form the identity matrix.

$$E=M*S \qquad \text{(Equ. 2)}$$

The basic operations are over elements of the base field $GF(2^q)$. For example, in the case that q=8, then each field element can be represented as a single byte of data. In many cases, as described in "Rizzo", it is efficient for both encoding and decoding to group field elements as follows. Suppose that the source block comprises k*T field elements, where T is a positive integer. Then, the field elements of the source block can be partitioned into k groups of T field elements each, and then each group can be considered to be a source symbol. Then, as described (in "Rizzo", for example), the same matrix vector multiplication operations are applied across the k source symbols to each of the T positions of the source symbols to generate n encoding symbols during FEC encoding, thus making it possible to calculate only once the sequence of operations to apply for each of the T positions. Similarly, during FEC decoding, a sequence of decoding operations can be calculated once and applied across the received encoding symbols to each of the T positions of the encoding symbols to recover the original k source symbols.

At least k of the encoding symbols must be received in order to recover the original k source symbols (assuming the same sized symbols and no additional information available about the original symbols). The matrix M' is formed from k rows of M corresponding to the k received encoding symbols to be used for decoding and the column vector E' comprising the k received encoding symbols to be used for decoding. Then decoding comprises solving for S based on E' and M' as described by Equation 3.

$$E'=M'*S \qquad \text{(Equ. 3)}$$

For Reed-Solomon codes, the construction of M is such that M' is always invertible, which makes decoding possible from reception of any k encoding symbols (for other FEC codes and linear transformations, it is possible that more than k encoding symbols need be received in order to solve for S). The amount of FEC decoding computation for solving Equation 3 for S is minimized if all the received source symbols are amongst the k encoding symbols included in E'.

The calculations required to solve for S based on Equation 3 may be performed in large part concurrently with the arrival of the encoding symbols as follows.

Figure 4:
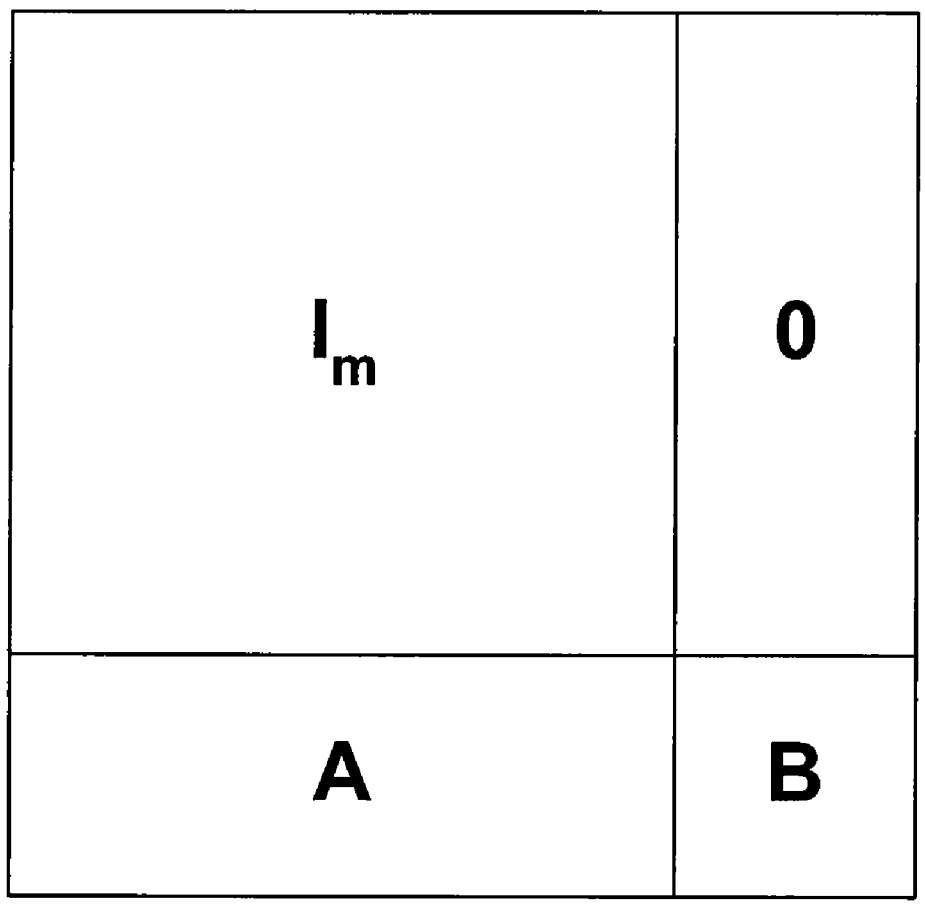
FIG. 4 is an example of a decoding matrix usable according to one embodiment of the present invention.

Let m be the number of source symbols received. Then, since we are describing a systematic linear transformation, the first m rows of M' contain a single entry each. We can permute E' and S and the rows and column of M' such that the first m rows and columns correspond to the received source symbols, the m×m submatrix in the upper left of M' is then the identity matrix and the m×(k−m) sub-matrix at the top right of M' is the zero matrix. So, M' has the format shown in FIG. 4, where $I_m$ is the m×m identity matrix, 0 is the m×(k−m) all zero matrix, A is a (k−m)×m matrix and B is a (k−m)×(k−m) matrix. The upper m rows of M' are written as $I_m|0$ and the lower (k−m) rows of M' are written as A|B and we now have the following Equations 4-5, where $E_1$ is the first m entries of E (received source symbols), $E_2$ is the last (k−m) entries of E (received repair symbols), $S_1$ the first m entries of S (received source symbols), and $S_2$ the last (k−m) entries of S (unknown source symbols that are to be solved for).

$$E_1=(I_m|0)*S=S_1 \qquad \text{(Equ. 4)}$$

$$E_2=(A|B)*S=A*S_1+B*S_2 \qquad \text{(Equ. 5)}$$

So, $$B*S_2=E_2-A*E_1 \qquad \text{(Equ. 6)}$$

and thus $$S_2=B^{-1}*(E_2-A*E_1) \qquad \text{(Equ. 7)}$$

Embodiments using concurrent decoding rely on the fact that $A*E_1$ can be calculated as source symbols arrive. The matrix A has the same number of rows as there are erased source symbols, since we chose the matrix M' to have exactly k rows.

For the description of the embodiment of the decoding method shown in FIGS. 5, 6 and 7 and described below, it is assumed that all source symbols for a source block that are to be received are received before any repair symbols for that source block are received, and furthermore that all encoding symbols are received in order of increasing index, where source symbols are indexed from 1 through k and repair symbols are indexed from k+1 though n. However, the quantity and pattern of erasures of encoding symbols is not known to the FEC decoder, and thus $A'*E_1$ is computed, where A' corresponds to the last n−k rows of M intersected with the columns of M that correspond to the m received source symbols.

Figure 5:
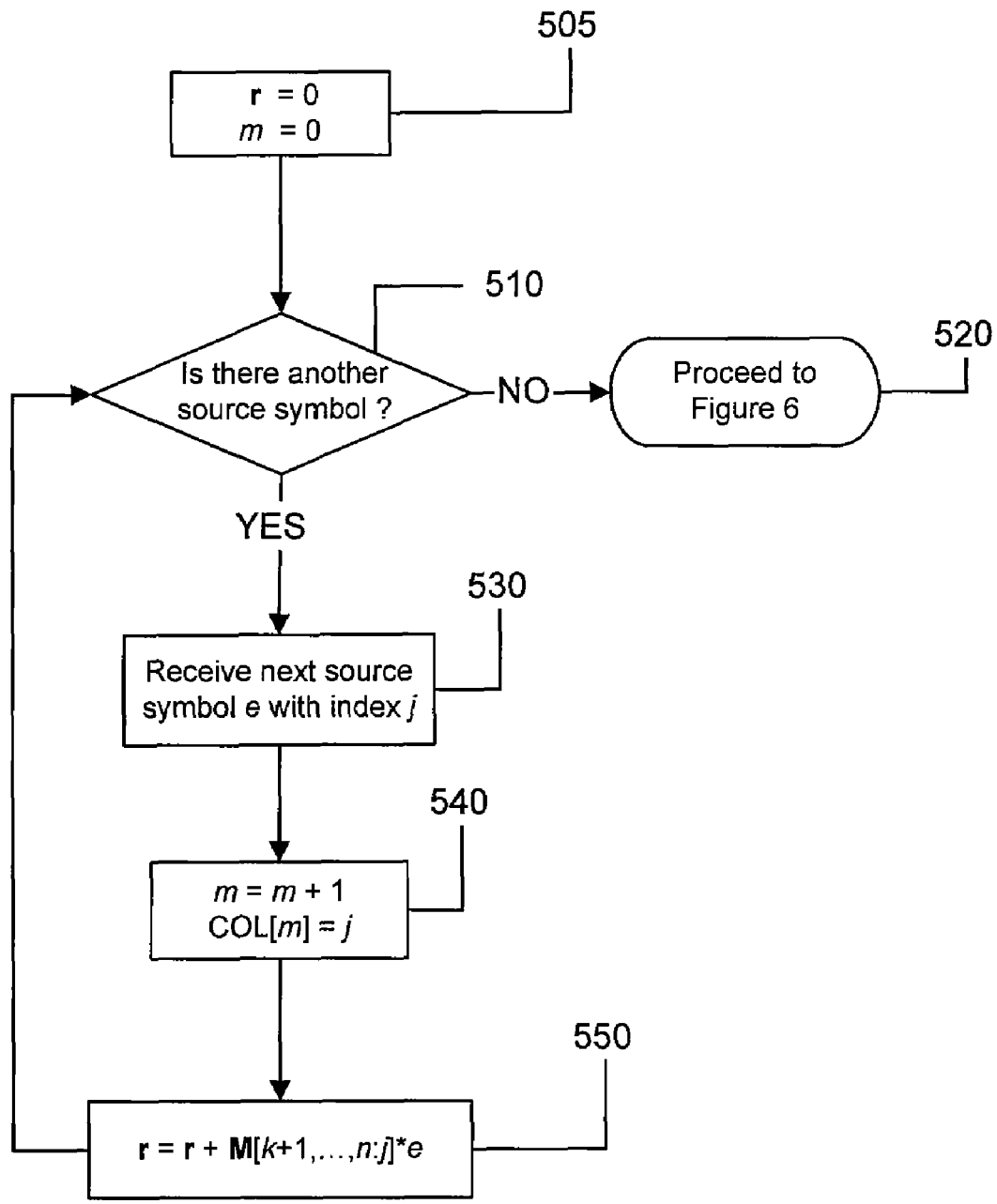
FIG. 5 is a flowchart of a part of a decoding process according to one embodiment of the present invention.

In FIG. 5, the process is shown that can be used as source symbols arrive. The variable m is initialized to zero in Step 505 to indicate that no source symbols have yet arrived, and the vector r of n−k symbols is also initialized to all zero symbols in Step 505. In Step 510, a test is made to see if there is another source symbol, and if there are no more source symbols, then the reception of source symbols proceeds to the process described in FIG. 6 as indicated in Step 520. If there is another source symbol, then in Step 530 it is received with symbol value e and with index j. In Step 540, the number of received source symbols m is incremented by one and a vector COL is updated to keep track of the index of the m-th received source symbol. In Step 550, the vector r of symbols is updated by adding the product of the vector M[k+1, . . . , n:j] and the received symbol value e, where M[k+1, . . . , n:j] corresponds to the last n−k rows of column j of M. Thus, when the process eventually reaches Step 520 in FIG. 5, the repair symbol vector r is equal to $A'*E_1$.

Figure 6:
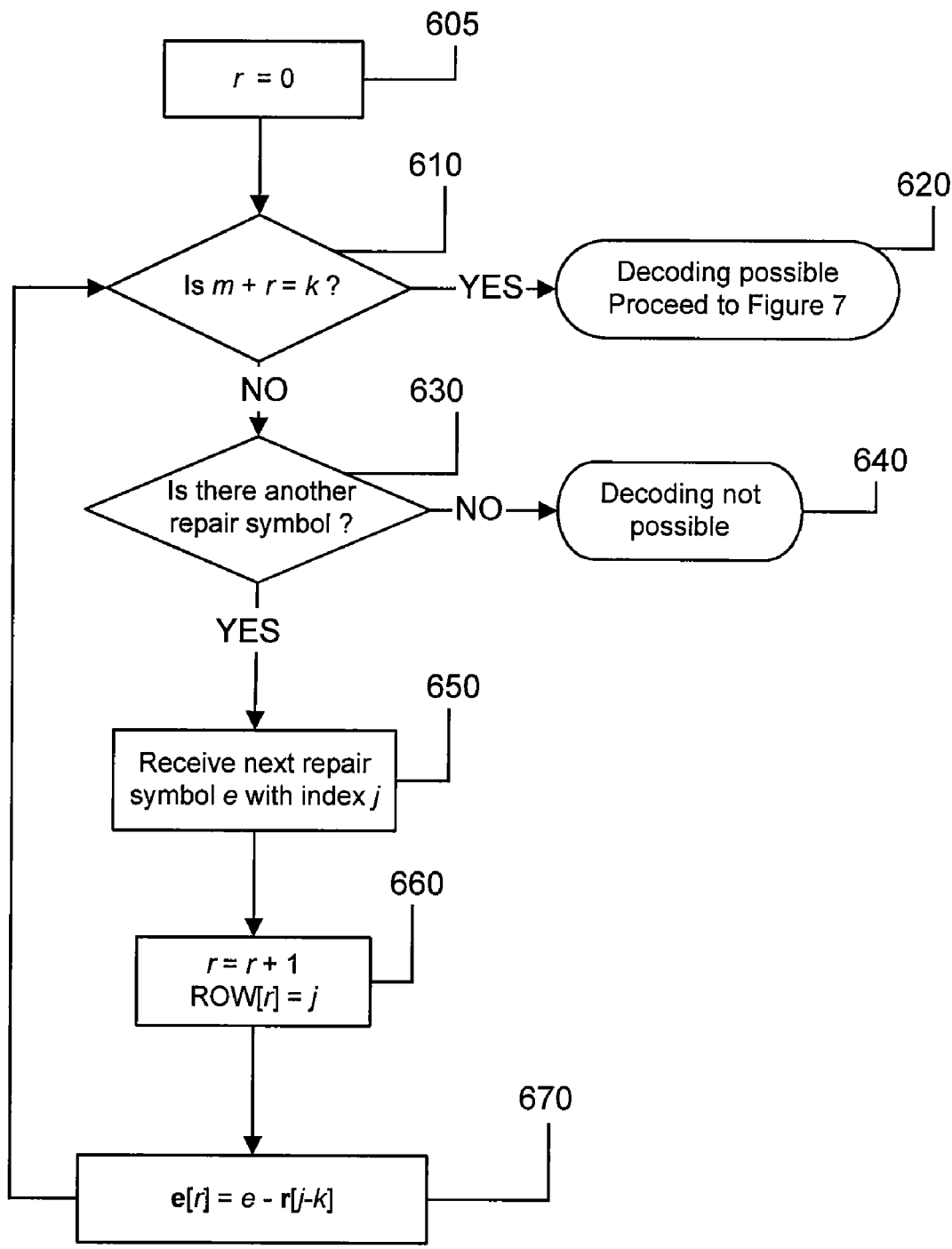
FIG. 6 is another flowchart of a part of the decoding process according to one embodiment of the present invention.

In FIG. 6, the process is shown that can be used as repair symbols arrive. The variable r is initialized to zero in Step 605 to indicate that no repair symbols have yet arrived. In Step 610 it is checked to see if the total number of encoding symbols that have arrived, i.e., m source symbols and r repair symbols, is equal to the total number k of source symbols in the source block. If k encoding symbols have arrived, then decoding is possible and the process proceeds to FIG. 7, as indicated in Step 620 of FIG. 6. If fewer than k encoding symbols have arrived, then the process proceeds to Step 630 in FIG. 6, where the process checks for receipt of another repair symbol. If there are no additional repair symbols, then decoding is not possible, as indicated in Step 640. If there is another repair symbol, then in Step 650 it is received with symbol value e and index j. In Step 660, the number of received repair symbols r is incremented by one and a vector ROW is updated to keep track of the index of the r-th received repair symbol. In Step 670, the r-th entry in a symbol vector e is set to e−r[j−k], where r[j−k] stores the symbol value corresponding to the repair symbol with index j in $A'*E_1$, and thus when the process eventually reaches Step 620 in FIG. 6, the symbol vector e is equal to $E_2-A*E_1$.

Figure 7:
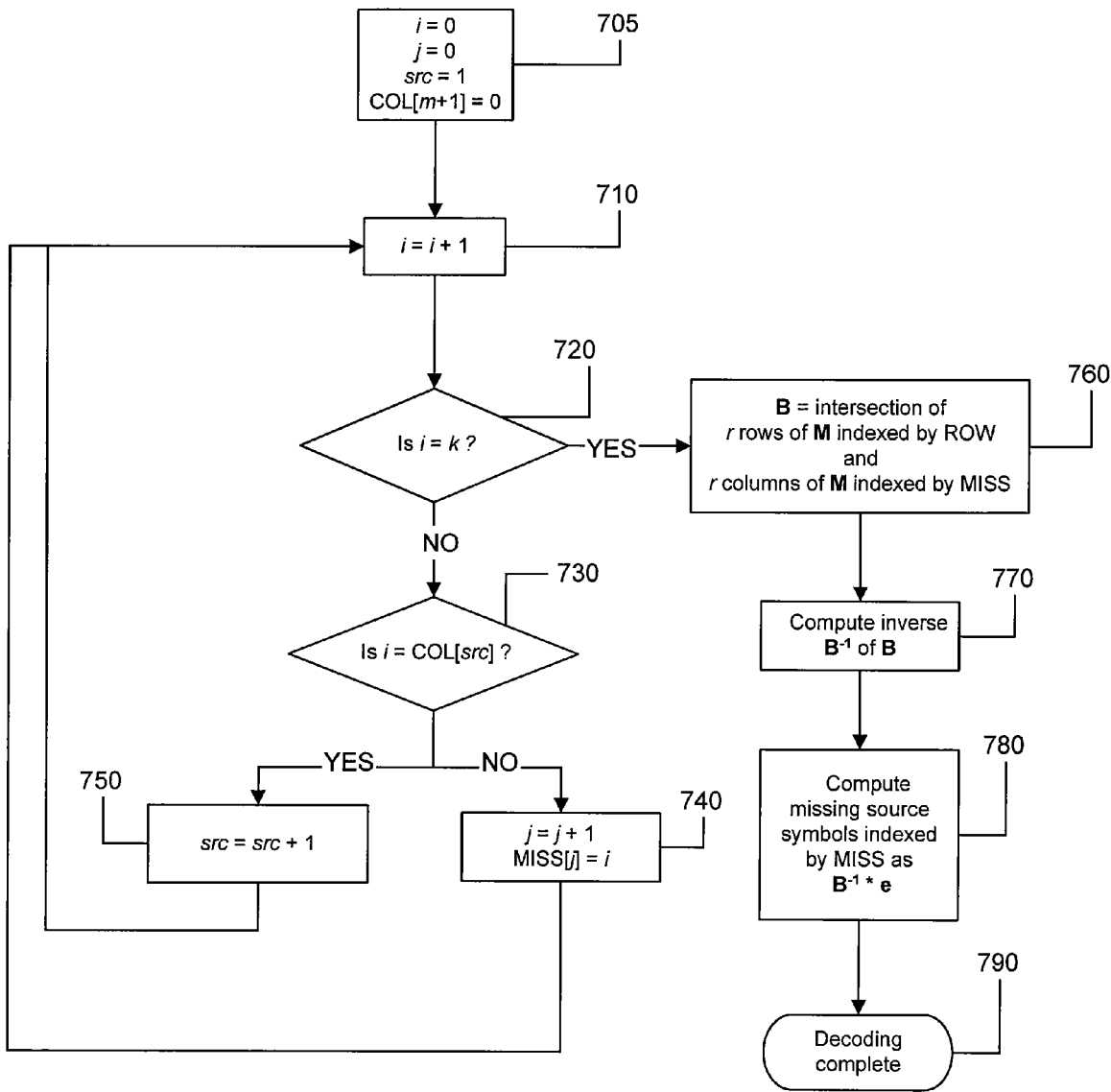
FIG. 7 is a flowchart of a variation of one of the decoding steps.

In FIG. 7, the final steps of the process are described that compute $B^{-1}*e=B^{-1}*(E_2-A*E_1)=S_2$, i.e., solves for the source symbols that are not received. In Steps 705 through 760 of FIG. 7, the matrix B is determined. In Step 705, the values of i,j, and src are all initialized to zero, where i is used to index through the k source symbols, j is used to keep track of the number of missing source symbols so far, and src is the index into the array of indices of received source symbols. Also, COL[m+1] is set to zero to simplify the subsequent logic, where COL is the array of indices of the m received source symbols that is computed as shown in FIG. 5. In Step 710 the value of i is incremented by one, and in Step 720, the decoding process includes checking if all the source symbols have been considered, and if not, then processing continues on to Step 730 where the process checks if i is the index of a received source symbol, i.e., if i=COL[src]. If i is the index of a received source symbol then this source symbol is skipped over in Step 750, but if i is the index of a missing source symbol then in Step 740 this index is saved in the vector MISS of missing source symbol values. After all k source symbols have been checked to see if they are missing and their indices appropriately added to the vector MISS, in Step 760, the process forms the matrix B as the intersection of the r rows of M indexed by the vector ROW of received repair symbols and the r columns of M indexed by the vector MISS of missing source symbols. In Step 770, the inverse $B^{-1}$ of B is computed, and then in Step 780 the missing source symbols are computed as $B^{-1}*e$, at which point decoding is complete as indicated in Step 790.

There are many variations of the above process. For example, it should be straightforward after reading this disclosure to modify the process so that source and repair packets arrive in any order. One of ordinary skill in the art should be able to, after reading this disclosure, identify many other variations of the methods that are taught here. Some additional variations and enhancements of the above process are described below.

Note that in the process just described, we calculate the potentially larger n−k vector of symbols $r=A'*E_1$. Once the number of erasures and the positions of received repair symbols is known, then elements of r can be discarded from $A*E_1$. As a result, this approach admits the possibility of performing unnecessary computations (since computed symbols of r may be discarded). However, this unnecessary computation takes place during time where otherwise the processor may not be occupied by FEC calculations. In should be apparent that the amount of total computation can be kept below the worst case of traditional decoding where all processing is initiated after the reception of k symbols to be used for decoding.

Note that in the process described above the vector of symbols r is stored while symbols arrive. An amount of memory equal to the total size of repair symbols is needed for this. When the rows of A' that will form A are identified, this memory can be reused. If it is possible to identify that a particular repair symbol will not be received, then the memory corresponding to that entry of r can be freed. As soon as sufficient repair symbols are received (i.e., a number of repair symbols equal to the number of missing source symbols), then the rows of A' that form A can be identified and any further repair symbols that are received can be discarded.

An amount of memory equal to n−k symbols is allocated for storage of r. In the worst case, a further amount of memory for k symbols is also needed to store source symbols as they arrive, i.e., the total memory requirement is n symbols.

In a further variation, the computation of $B^{-1}*(E_2-A*E_1)$ as shown in FIG. 7 can be divided into two sub-steps, the first of which is performed as repair symbols arrive. This relies on reconfiguring the decoder so that instead of operating according to Equation 6, it operates according to Equation 8, row by row, as repair symbols arrive.

$$B_U*S_2=B_L*(E_2-A*E_1)$$ (Equ. 8)

In Equation 8, $B_U$ is in upper triangular form and $B_L$ is in lower triangular form. With each repair symbol (i.e., element of $E_2$) that arrives, an additional row of each of these matrices can be calculated by performing a step of the Gaussian elimination process for inversion of B.

Furthermore, the value of $B_L*(E_2-A*E_1)$ can also be calculated as repair symbols arrive. It is important to note that in this phase, workload is not spread out uniformly over the time that the repair symbols arrive, since each successive repair symbol requires more work than the last in order to calculate the value of the associated entry in $B_L*(E_2-A*E_1)$ The remaining work to be performed once sufficient repair symbols have arrived is thus solution of the system (Equ. 8), which can be done by back-substitution.

Sending Repair Packets First

Certain variations can be made to the above process if repair packets are sent in advance of source packets. This approach has the cost of injecting additional delay at the FEC sender, since source packets must then be buffered if they are to be sent after the repair packets.

There are a number of advantages of this approach however. Receivers that join the stream in the middle of a source block, in good reception conditions, will receive a larger amount of source data and thus FEC receiver latency is reduced. The positions of lost repair packets are known, and thus calculation of elements of $(E_2-A*E_1)$ corresponding to these symbols can be avoided. If the number of received repair symbols is r, then once k−r source symbols have been received, rows of $(E_2-A*E_1)$ can be discarded and the calculations associated with subsequently received source symbols reduced. As a result, decoding can be completed using only memory for k symbols in total.

Improved Interleaving for 2D Codes

A two-dimensional code is one in which symbols are arranged into a two-dimensional grid and independent erasure correction codes applied to the symbols of each row and to the symbols of each column. The decoding procedure may be iterated, depending on computational and other resources available, thereby potentially increasing the error correction capability of the code. Any error correction code can be applied in this way, for example Reed-Solomon codes or XOR codes. This description presents this class of codes in terms of erasure codes, however as will be clear to one skilled in the art of error and erasure corrections codes, the same approach could easily be applied to error correction codes.

As is well-known, the performance of a two dimensional code can be improved by sending the encoding symbols in an order other than the original order. However, this adds complexity for a receiver that does not support the FEC code and increases the time required for reception of the file in the case of low losses between sender and receiver. In the case of mobile terminals, this additional reception time implies additional power consumption and this reduces battery life.

An alternative approach is to apply a non-trivial permutation to the original order of the source symbols before applying the two-dimensional code. The source symbols are then sent in the original order, reducing complexity for receivers that do not support FEC and reducing the reception time in the case of low losses. Repair symbols are sent before, interspersed, or after the source symbols, either in the order they were generated or in some other order.

In this approach, both sender and receiver are aware of the permutation that has been applied. This can be achieved by deriving the permutation in a well-defined and systematic way that is known to both the sender and receiver. For example, a particular pseudorandom number generation process could be defined at both sender and receiver and used to generate the permutation. Another example would be to define the permutation by the following process:

Let k be the number of source symbols and let k' be the smallest prime integer greater than or equal to k. Choose two integers, a and b, that are less than k. Then, if the source symbols are originally numbered $0, \ldots, k-1$, the new ordering is defined as follows:

1) If all source symbols have been added to the new ordering, then stop
2) If b<k, then the next source symbol in the new ordering is symbol b
3) b=(b+a) mod k'
4) Go to (1)

A disadvantage of the above method is that it remains possible, depending on the permutation chosen, that two symbols adjacent in the original symbol sending ordering appear in the same row or the same column in the two-dimensional code. This has a negative effect on the vulnerability of the code to burst losses, since loss of the two adjacent symbols is concentrated within a single row or column.

In a further variation, a permutation is chosen which never maps adjacent symbols into the same row or column. If the source block is square, such a permutation can be defined, for example, by choosing two permutations, $\sigma_1$, $\sigma_2$ of the numbers $0, \ldots, k_1 = k_2$, where $k_1$ and $k_2$ are the number of rows and columns in the two-dimensional source block respectively. Then let s[i,j] denote the symbol in position (i,j) in the source block and s'[i,j] denote the symbol at position (i,j) in the permuted source block. Then we define:

$$s'[i,j] = s[(\sigma_1(j) + \sigma_2(i)) \% k_1, j] \qquad \text{(Equ. 9)}$$

The two-dimensional code is then applied to the permuted source block. Source symbols are sent in the original order. Repair symbols may then be sent in any order. Advantageously, repair symbols from the same row or column code are never sent consecutively.

Generalized Codes

In this section, we introduce a generalized class of multi-dimensional codes. The encoding and decoding processes for this generalized class of codes are roughly equivalent in implementation complexity to those for the specific case of two-dimensional codes. As before, this description is presented in terms of erasure correction codes but it should be understood that the techniques presented herein can also be applied to error correction codes.

A code in this generalized class can be defined in terms of a binary matrix with one column for each source symbol and one column for each repair symbol. Each row of this matrix represents a distinct erasure correction code as follows. These distinct erasure codes are referred to herein as component erasure codes and the overall code as the compound code. In the case of two-dimensional codes such as those described above the component erasure codes are the individual row and column codes and the compound code is the two-dimensional code formed from the combination of the component codes. For the generalized case, for each row, a component erasure correction code is constructed where two conditions are present.

The first condition is that the source symbols for the component code comprise those source symbols of the compound code whose column has a "1" in the specific row plus those repair symbols of the compound code whose column has a "1" in the specific row and where the compound code repair symbol's column has a "1" in a row of lower index within the matrix. We call these symbols "component code source symbols" to distinguish from the source symbols for the compound code as a whole.

The second condition is that the component code repair symbols comprise those compound code repair symbols whose column has a "1" in the specific row and whose column does not have any "1"'s in rows of lower index. We call these symbols "component code repair symbols" to distinguish from the repair symbols for the compound code as a whole.

Thus the value of a given compound code repair symbol is determined by the component erasure code corresponding to the first row with a "1" in the column corresponding to that repair symbol. This repair symbol may then appear as a component code source symbol within a subsequent row in the matrix.

In the generalization presented here, the 2D Reed-Solomon code is described in terms of a matrix with $k_1 + k_2$ rows and $(k_1 * k_2) + k_1 * (n_2 - k_2) + k_2 * (n_1 - k_1)$ columns. The first $k_1$ rows correspond to the Reed-Solomon codes across the rows in the usual 2 dimensional representation. The remaining $k_2$ rows correspond to the Reed-Solomon codes across the columns in the usual 2 dimensional representation. Here, $(n_1 - k_1)$ is the number of repair symbols generated for each column of the 2D Reed-Solomon code, and $(n_2 - k_2)$ is the number of repair symbols generated for each row of the 2D Reed-Solomon code.

Clearly, any multi-dimensional Reed-Solomon code can be represented in this form.

Additional codes can be constructed using different matrix constructions. For example, the general class of Low Density Parity Check (LDPC) codes provides examples of codes in this class based on the XOR erasure code. The generalization presented here allows the matrices which define these codes to be applied using other erasure codes, for example Reed-Solomon codes. In this generalization, since Reed-Solomon is used in place of XOR operations, then multiple repair symbols may be generated for each row of the matrix.

Finally, the matrices for chain reaction codes (for example, those described in Luby I and elsewhere) and multi-stage chain reaction codes (for example, those described in Shokrollahi I and elsewhere) can also be applied to this generalization to generate new codes with the properties of a fountain code.

In order to apply this generalization, the matrix describing the code should be known to both the FEC encoder and FEC decoder. In the case of a specific code, the structure of the matrix may be provided in advance to both FEC encoder and FEC decoder and only specific parameters describing the exact code supplied over the communication channel.

Codes of the class described here can be decoded by a common decoding algorithm which is a generalization of the algorithm used for 2 dimensional codes. The receiver collects as many source and repair symbols as possible from the communication channel and then repeats the following process:

a) Calculate for each matrix row the number of symbols (component code source and component code repair) which remain unknown for that row;

b) For each row where the number of unknown symbols is less than or equal to the number of component code repair symbols (i.e., the repair symbols originally generated by the component code for that row), attempt a row decoding operation to determine the values of the unknown component code source symbols. If this decoding operation is successful, and if any component code repair symbols remain unknown, perform an encoding operation to determine the values of the unknown component code repair symbols; and c) If any operations were performed in step (b), and some source symbols remain unknown, return to step (a). Otherwise, stop.

The above process is described by way of example only. Further optimizations may be applied, for example, to avoid the calculation of component code repair symbols which have no chance of assisting in further decode operations. The operations can be performed by a decoder portion of a receiver implemented by hardware, software, etc.

Finally, as noted above, the above generalized code construction is not restricted to Reed-Solomon codes—any erasure code can be applied to construct the row repair symbols for each row. Clearly, where an XOR operation is used then the result is the well known class of LDPC codes, including the codes referenced above.

FEC Sending

In this section we describe methods and processes for the FEC sender to time the sending of packets (both source and repair packets). We concentrate on the sending of the packets for a single source block, and note that these processes and methods are designed to seamlessly apply to a source stream that is partitioned into source blocks.

Let k be the number of source symbols in the source block, let T be the protection period for the source block, let p be the protection amount expressed as a fraction, and thus $p \cdot k$ repair symbols will be sent for the source block. The values of k, T and p may be determined dynamically by the FEC sender as each source block is being formed, and thus the values of k and T for a source block may only be known to the FEC sender when most or all of the source symbols for that source block have arrived at the FEC sender, and the value of p may be determined after all the source symbols for the source block have arrived at the FEC sender. Also, the FEC sender may vary the symbol size for different source block. Thus, many or all of these parameters for a particular source block may be known to the FEC sender well into the reception of data for that source block.

If there are no concerns about FEC end-to-end latency, the following FEC basic sender is often adequate.

FEC basic sender: Buffer the source symbols for the source block as they arrive, say over a period of T seconds. Then generate the $p \cdot k$ repair symbols for the source block, say over a period of T seconds. Then, send the source and repair symbols uniformly spread over the subsequent T seconds.

The FEC basic sender has the following properties
1. The protection period is T, which is the same as the time for receiving the source symbols at the FEC sender.
2. The symbols sent for the source block are spread out evenly over time. This implies that the level of protection provided against loss when there is a burst outage of a fixed duration does not depend on when the outage occurs during transmission of the symbols, which is a desirable property.
3. The FEC sender does not introduce fluctuations in the overall sending rate of symbols. In particular, if the original sending rate of source symbols is constant then the sending rate of all symbols is still constant, and if the original arrival rate of source symbols at the FEC sender is variable then at least the constant sending rate of symbols per source block dampens fluctuations. This is a desirable property.
4. The FEC receiver latency can be as little as T. This implies minimal buffering of $(1+p) \cdot k$ symbols (assuming that all source blocks comprise k source symbols), which is the minimal possible and is thus desirable.
5. The symbols for source blocks are not interleaved. This makes the FEC receiver logic simple and is thus desirable.

The one undesirable property that the FEC basic sender has is that the FEC end-to-end latency is $2 \cdot T + T$, which can be significant. For interactive or live applications, it is very desirable to minimize the FEC end-to-end latency, and thus for these applications the following FEC senders are described and considered.

FEC sender A: Send the source symbols as they arrive, say over a period of R seconds. Send repair symbols equally spread out over the reception and sending of the source symbols for the next source block.

FEC sender A has the following properties
1. The protection period T is $2 \cdot R$ (assuming the next source block also comprises the source symbols received over a period of R seconds).
2. The symbols sent for the source block are not spread out evenly over time, even if the source symbol arrivals are spread out evenly over time. This is because the average time between sending subsequent source symbols is k/R, whereas the average time between sending subsequent repair symbols is $p \cdot k/R$. This implies that the level of protection provided against loss when there is a burst outage of a fixed duration depends on when the outage occurs during transmission of the symbols. This means that if one is designing the protection amount in order to withstand a given outage duration independent of when the outage occurs then one would have to provide an amount of protection that is non-optimally based on either the rate of source symbol transmission or repair symbol transmission, whichever is larger. This is an undesirable property in certain applications.
3. The overall sending rate of symbols for the entire source stream does not fluctuate significantly from the sending rate of the source symbols. In particular, if the original sending rate of source symbols is constant then the sending rate of all symbols is still constant, and if the original sending rate of source symbols is variable then since repair packets are sent evenly spread out the variability of the original source stream is somewhat dampened. This is a desirable property.
4. The FEC receiver latency is at least $T = 2 \cdot R$, which is undesirable in some applications, for example interactive applications, since the duration of the original source block is only R. This implies that buffering of at least $(2+p) \cdot k$ symbols is required (assuming that all source blocks comprise k source symbols). This is a lot larger than the minimal possible $(1+p) \cdot k$, and thus this is undesirable in some applications.

5. The repair symbols for one source block are interleaved with the source symbols from the next source block. This makes the FEC receiver logic more complicated than it potentially needs to be, as this requires keeping track of and saving symbols for more than one source block concurrently, and also makes it somewhat difficult to determine when to decide no additional symbols from a given source block are going to arrive and to give up on trying to decode that source block.

Thus, overall FEC sender A is of mixed quality, and may not preferred in certain applications.

FEC sender B: Send the source symbols as they arrive, say over a period of R seconds. Send repair symbols spread out evenly at the average rate of source symbol arrival, thus the repair symbols are equally spread out over $p \cdot R$ seconds.

FEC sender B has the following properties:

1. The protection period T is $(1+p) \cdot R$.
2. The symbols sent for the source block are spread out evenly over time, if the source symbols arrivals are spread out evenly over time. This implies that the level of protection provided against loss when there is a burst outage of a fixed duration does not depend on when the outage occurs within the transmission of symbols for the source block, and this is a desirable property.
3. Fluctuations in the overall sending rate of symbols for the entire source stream are introduced. In particular, even if the original sending rate of source symbols is constant then since the transmission of repair symbols only partially overlaps the sending of symbols for subsequent source block(s), the overall transmission rate of the symbols can be quite variable and choppy. This is not a desirable property in certain applications.
4. The FEC receiver latency is at least $T=(1+p) \cdot R$, which is undesirable in some applications since the duration of the original source block is only R. This implies buffering of at least $(1+2 \cdot p) \cdot k$ symbols is required (assuming that all source blocks comprise k source symbols). This is a larger than the minimal possible $(1+p) \cdot k$.
5. The repair symbols for one source block are interleaved with the source symbols from the next source block (and possibly also subsequent source blocks, depending on the value of p). This makes the FEC receiver logic more complicated than it potentially needs to be, as this requires keeping track of and saving symbols for more than one source block concurrently, and also makes it somewhat difficult to determine when to decide no additional symbols from a given source block are going to arrive and to give up on trying to decode that source block.

Thus, overall FEC sender B is of mixed quality, and may not be preferred for certain applications. Note that strategies A and B did not take into account that the FEC encoder may take a significant amount of time to produce repair symbols after the last source symbol is received, and in a practical FEC sender this would have to be taken into account. However, it should be noted that modifying the strategies to take the FEC encoding time into account would not ameliorate any of their undesirable properties.

A preferred embodiment in some conditions would be FEC sender C described below.

FEC sender C: The source symbols that form a source block arrive over a period of $R=T$ seconds, where T is the protection period. Let $u=p/(1+p)$ and let $T \geq u \cdot T$, where $T-u \cdot T$ is enough time after the reception of the last source symbol for a source block for the FEC encoder to generate the first repair symbol for the source block and be able to continue to generate subsequent repair symbols for the source block at the sending rate prescribed below. Let t be the current time at the FEC sender.

1. When the source block is initiated by the FEC sender, t is initialized to $t=0$.
2. While the current time t is in the interval $0 \leq t \leq T$, each time a source symbol is received at current time t, it is scheduled to be sent at time $T+t/(1+p)$.
3. Suppose k source symbols have been received when the source block is completed at time T. The $p \cdot k$ repair symbols for the source block are scheduled to be transmitted uniformly over the time interval from $T+T/(1+p)$ to $T+T$ (which is an interval of length $u \cdot T$).

FEC sender C has the following properties:

1. The protection period T is the same duration as the period of time during which source symbols arrive for the source block.
2. Fluctuations in the overall sending rate of source symbols are compressed in time by a factor of $1/(1+p)$, but remain of the same magnitude. This may not be entirely desirable in some applications because as the protection amount increases the amount of bandwidth used by the FEC encoded stream increases and thus it would be more desirable when using more bandwidth to reduce the magnitude of fluctuations in the streaming rate. This also implies that the level of protection provided against a burst loss of fixed duration can depend on when the loss occurs, and this may not desirable. However, as a special case, if the original sending rate of source symbols is constant then the sending rate of the FEC encoded stream is also constant, and thus also the level of protection provided for a burst loss of fixed duration does not depend on when the loss occurs.
3. The FEC end-to-end latency can be as low as $T+u \cdot T$, as the FEC encoding and FEC decoding latencies approach zero.
4. The FEC receiver latency can be as low as T as the FEC decoding latency approaches zero. This implies buffering of only $(1+p) \cdot k$ symbols is required (assuming that all source blocks comprise k source symbols). This is the minimal amount possible and thus this is desirable.
5. The repair symbols for one source block are not interleaved with the source symbols from the next source block, i.e., all symbols for one source block are sent before any symbols for a subsequent source block are sent. This makes the FEC receiver logic simple, as this requires keeping track of and saving symbols for essentially only one source block concurrently, and also makes it easy to determine when to decide no additional symbols from a given source block are going to arrive and to give up on trying to decode that source block.
6. The FEC sender takes into account that the FEC encoder may take a significant amount of time to produce repair symbols after the last source symbol is received, as there is a time delay of $T-u \cdot T$ between the arrival of the last source symbol and the sending of the first repair symbol, where T is a parameter that can be appropriately adjusted based on the capabilities of the FEC encoder.

Thus, overall FEC sender C is desirable in each way described except that, as described in property 2 in the list above, FEC sender C maintains the original magnitude of fluctuations in the sending rate of the source symbols.

FEC sender D described below maintains all of the desirable properties listed above for FEC sender C, but also the beneficial result of dampening the magnitude of fluctuations in the sending rate of source symbols. Thus, FEC sender D has several advantages and may be a preferred embodiment in some instances.

FEC sender D: The source symbols that form a source block arrive over a period of T seconds, where T is the protection period. Let $u=p/(1+p)$ and let $T \geq u \cdot T$, where $T-u \cdot T$ is enough time after the reception of the last source symbol for a source block for the FEC encoder to generate the first repair symbol for the source block and be able to continue to generate subsequent repair symbols for the source block at the sending rate prescribed below. Let t be the current time at the FEC sender. At each point in time in the process, let B be the number of source symbols that have been received for the source block and let S be the number of these source symbols that have been sent so far by the FEC sender.

The process begins when the source block is initiated by the FEC sender, and the process initializes $t=0$ and $B=S=0$. Then, while the current time t is in the interval $0 \leq t \leq T$, each time a source symbol is received, B is set to $B+1$ and while the current time t is in the interval $T<t \leq T$, each time a source symbol is received, B is set to $B+1$ and, at time t, define $y_t$ according to Equation 9, where at each point in time x prior to the current time t, $B_x$ and $S_x$ were the respective values of B and S at time x. If $y_t \geq 1$ at time t, then the process sends the next received, but not yet sent, source symbol and sets $S=S+1$.

$$y_t = \int_{x=T'}^{t} (B_x - S_x)/(T' - u \cdot x)dx - S \qquad \text{(Equ. 9)}$$

Following those steps, all source symbols have been received by time T, and thus there are $k=B_T$ source symbols in the source block. At this point, the process sends the remaining $B_T-S_T$ unsent source symbols spread uniformly over the interval of time $T<t \leq T+T/(1+p)$ while the current time t is in this interval. Next, the process sends the $p \cdot k$ repair symbols spread uniformly over the interval of time $T/(1+p)<t \leq T+T$ while the current time t is in this interval.

FEC sender D has the desirable properties of FEC sender C, and in addition property 2 of FEC sender C is improved to the following for FEC sender D in that fluctuations in the overall sending rate of symbols for the entire source stream are dampened. In particular, fluctuations in the source stream are dampened more significantly as T increases, and generally T increases as the protection amount increases.

This is desirable because as the protection amount increases the amount of bandwidth used by the FEC encoded stream increases and thus it is even more desirable when using more bandwidth to reduce fluctuations in the streaming rate. This is also desirable because as the fluctuations dampen the level of protection provided against loss when there is a burst outage of a fixed duration depends less strongly on when the outage occurs, and this is a desirable property. As a special case, if the original source stream is constant rate, then the FEC encoded stream is also constant rate. Thus, overall FEC sender D can be more desirable than the other senders, and is thus preferred for many conditions.

There are many possible variations of FEC sender D, some of which are described herein and others that will be apparent to one of ordinary skill in the art after reading this disclosure.

For example, in Step 3b there is the calculation of $y_t$, and there are many possible methods for performing this calculation, including simple approximations instead of exact calculations, that will yield similar results. As another example, in Step 3c the decision on when to send another source symbol based on the condition $y_t \geq 1$ can be varied, for example replaced with the condition $y_t \geq 0$ or $y_t \geq \alpha$ for some constant $\alpha$. Such variations will yield similar results. As another example of a variant, instead of sending the next source or repair symbol individually, groups of symbols may be received or sent together in each packet, and the size of the group received or sent in each packet may vary packet by packet. In this case, the procedures for accounting for received symbols, and the procedures for when to send the next source or repair symbol can be easily modified in straightforward ways.

As an example of another variant, it may be the case that bits instead of symbols are sent and received, i.e., potentially portions of a symbol instead of an entire symbol at a time, and the procedures for sending and receiving symbols can be easily modified to accommodate sending and receiving data for example in units of bits or in units of variable size packets instead of symbols.

One possible variation on FEC sender D is FEC sender E described below and shown in FIGS. 8A, 8B, 9, 10, 11, 12 and 13. FEC sender E is similar to FEC sender D and in particular T is the duration of a protection period and the duration of a source block, $u=p/(1+p)$ and $T \geq u \cdot T$ is the duration of time between when the sender starts receiving source symbols for the current source block and when the sender starts sending source symbols for the current source block. FEC sender E breaks the processing of a current source block down into four processes, the Source Initial Process, the Source Mid Process, the Source Final Process and the Repair Send Process, as shown in FIG. 8A. The relative time interval and duration of each of these four processes is shown in the column labeled "Time interval" and the column labeled "Duration", respectively, in FIG. 8A. The time interval is expressed relative to the time that the current source block is started, and thus time $t=0$ corresponds to the time when the current source block is started. Thus, as shown in FIG. 8A, the Source Initial Process starts at time $t=0$ and ends at time $t=T$ and is thus of duration T. Similarly Source Mid Process starts at time $t=T$ and ends at time $t=T$ and is thus of duration $T-T$; Source Final Process starts at time $t=T$ and ends at time $t=T+T/(1+p)$ and is thus of duration $T-u \cdot T$; Repair Send Process starts at time $t=T+T/(1+p)$ and ends at time $t=T+T$ and is thus of duration $u \cdot T$.

Note that as shown in FIG. 8B the four processes for different source blocks are overlapping. For example, the Source Initial Process for the current source block is concurrent first with the Source Final Process of the previous source block and then with the Repair Send Process of the previous source block. As another example, the Source Final Process of the current source block and then the Repair Send Process of the current source block is concurrent with the Source Initial Process of the next source block.

As shown in FIG. 8B, at each point in time source symbols are being received for exactly one source block and encoding symbols are being sent for exactly one source block. For example, encoding symbols are being sent for the previous source block and source symbols are being received for the current source block during the Source Initial Process of the current source block. As another example, source symbols are being received for the current source block and encoding symbols are being sent for the current source block during the Source Mid Process of the current source block.

FEC sender E has the following properties: (a) Source symbols are received for each source block for T seconds; (b) Encoding symbols are sent for each source block for T seconds; (c) There is a T time duration between the start of receiving source symbols for a source block and the start of sending source symbols for that source block; (d) All source symbols for the current source block are received before any source symbols for the next source block are received; (e) All encoding symbols for the current source block are sent before any encoding symbols for the next source block are sent. Thus, FEC sender E does not have any interleaving of source blocks.

Figure 9:
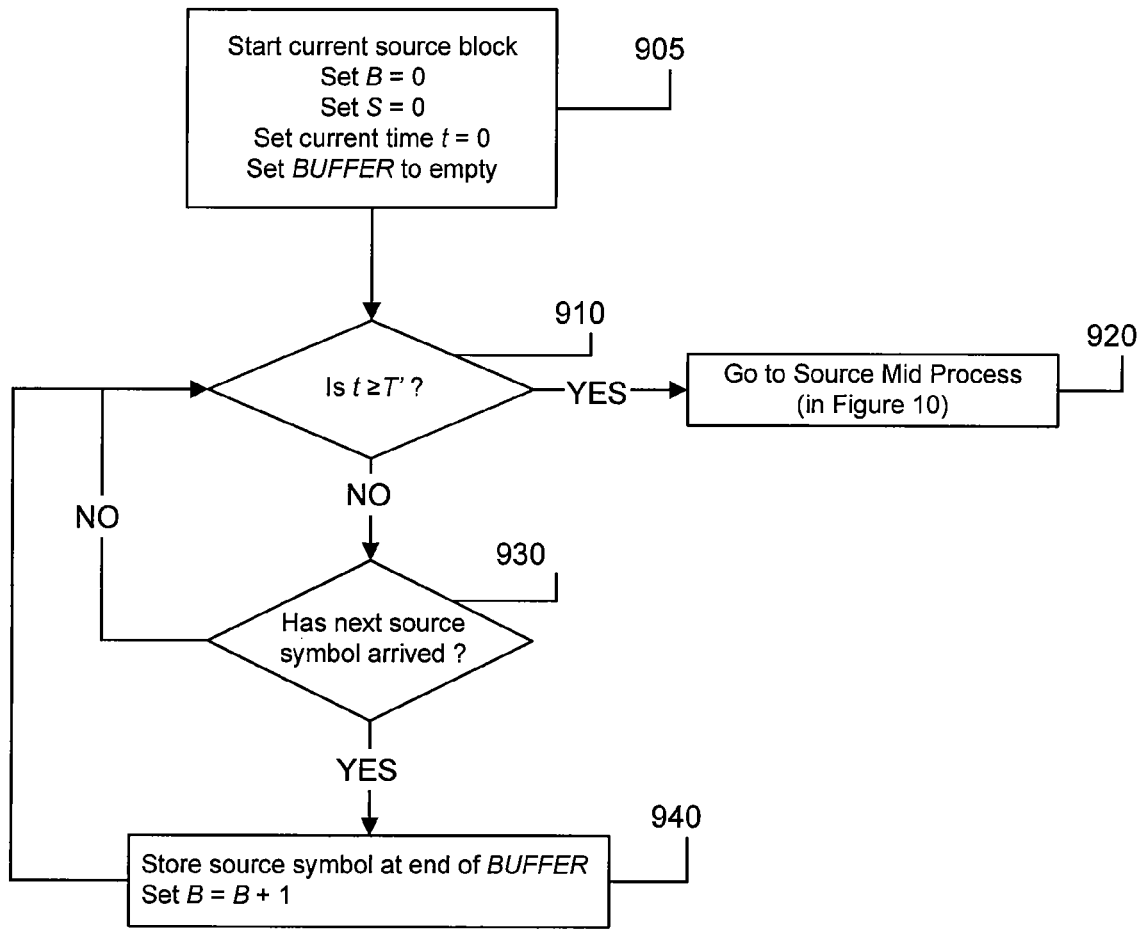
FIG. 9 is a flowchart of a Source Initial Process for an FEC sender.

FIG. 9 illustrates the Source Initial Process for FEC sender E. In Step 905 of FIG. 9 the current source block starts, and thus the number of received source symbols B and the number of sent source symbols S for the current source block are both initialized to zero, the current time t is set to zero, and the BUFFER that is used to buffer source symbols for the current source block is initialized to be empty. In Step 910 it is checked to see if the current time t is greater than or equal to T, and if so then processing passes on in Step 920 to the Source Mid Process shown in FIG. 10. Note that the implementation of the test in Step 910 is generally meant to occur frequently enough so that t is very close to T when the test is true. This same comment applies to all further steps described below where inequality comparisons are made between two times in all the processes of FEC sender E. If t is less than T in Step 910 then in Step 930 it is checked to see if the next source symbol has arrived. If the next source symbol has not arrived then processing loops back to Step 910, but if the next source symbol has arrived then in Step 940 the number B of received source symbols is incremented and the received source symbol is added to BUFFER before processing loops back to Step 910.

Figure 10:
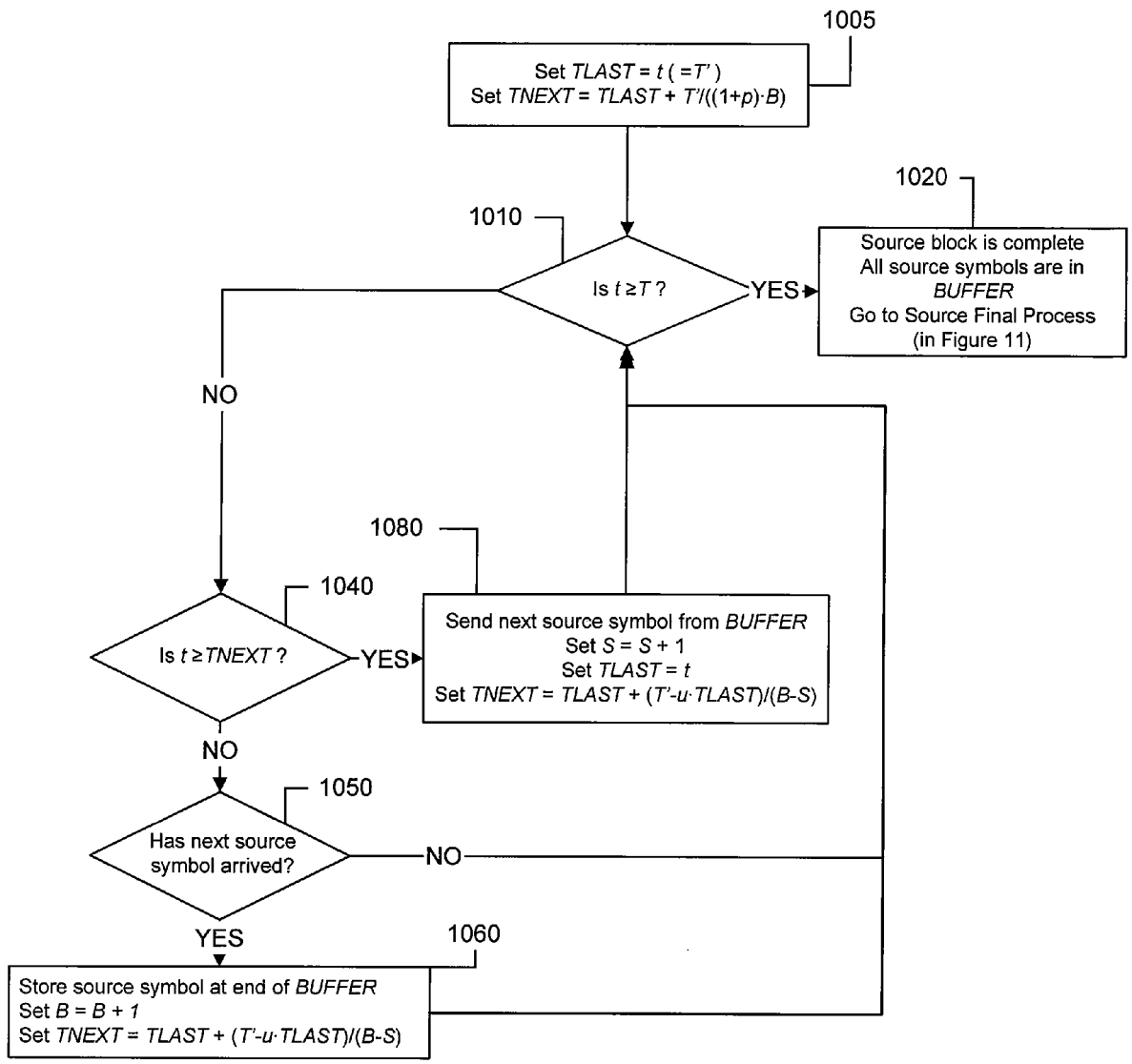
FIG. 10 is a flowchart of a Source Mid Process for an FEC sender.

FIG. 10 illustrates the Source Mid Process for FEC sender E. In Step 1005 of FIG. 10 the value of TLAST is initialized to the current time t (which is greater than or equal to T but very close to T depending on the precision of the test in Step 910 of FIG. 9), and TNEXT is initialized to TLAST+T/((1+p)·B). TNEXT is the time that the next source symbol is scheduled to be sent. In Step 1010 it is checked to see if the current time t is greater than or equal to T, and if so then processing goes to Step 1020, which indicates that the reception of source symbols for the current source block is complete, and thus BUFFER contains all the source symbols for the source block and processing passes on in Step 1020 to the Source Final Process shown in FIG. 11. If t is less than T in Step 1010 then in Step 1040 it is checked to see if t is greater than or equal to TNEXT. If the test is true in Step 1040 then it is time to send the next source symbol and thus processing passes to Step 1080. In Step 1080 the first received source symbol not yet sent is sent, the number S of sent source symbols is incremented by one, TLAST is updated to the current time and TNEXT is updated to TLAST+(T−u·TLAST)/(B−S) and then processing loops back to Step 1010. If the test is false in Step 1040 then it is checked to see if a source symbol has arrived in Step 1050. If no source symbol has arrived then processing loops back to Step 1010, but if a source symbol has arrived then processing continues to Step 1060. In Step 1060 the source symbol that has arrived is appended to the end of BUFFER, the value of B is incremented by one, and TNEXT is updated based on the reception of the source symbol to TLAST+(T−u·TLAST)/(B−S) and then processing loops back to Step 1010 immediately.

Figure 11:
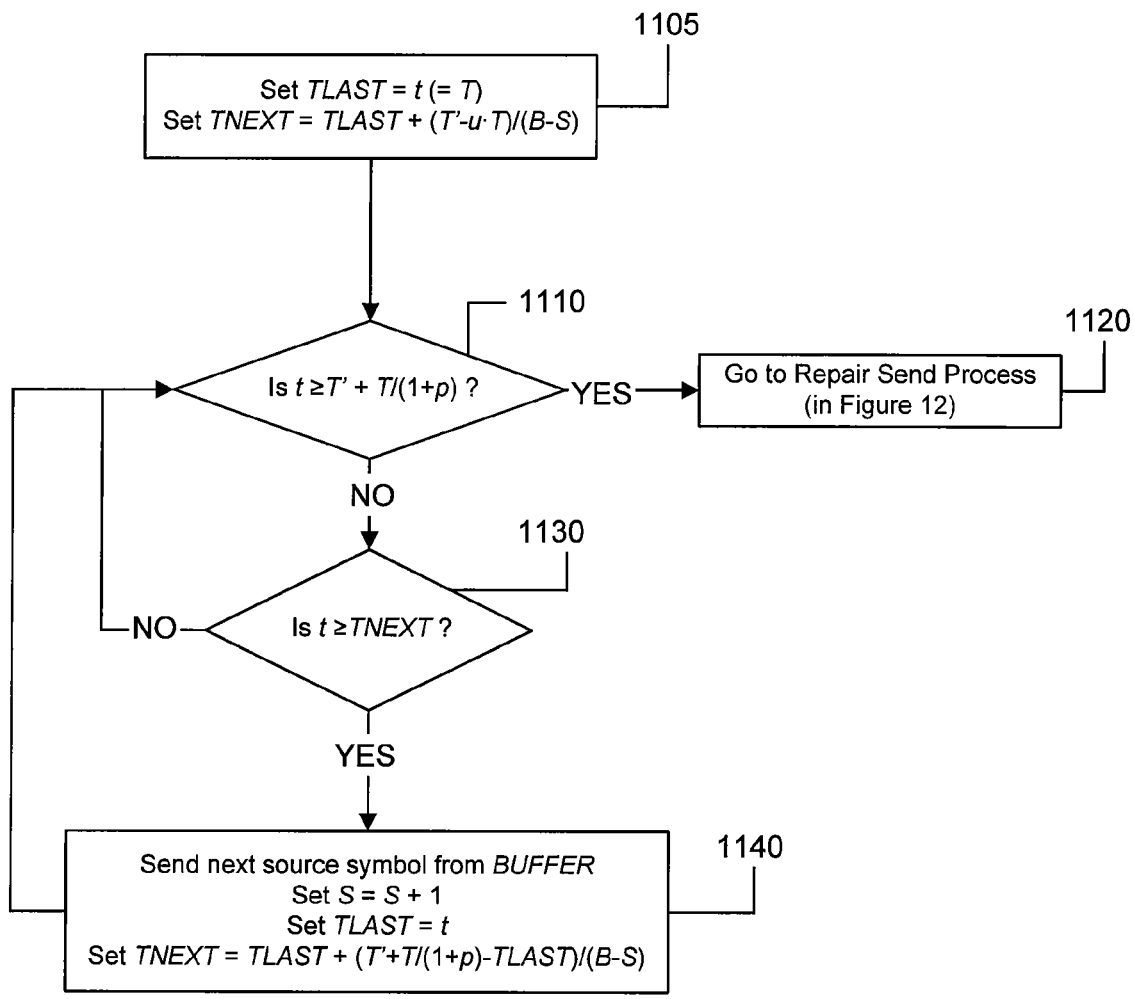
FIG. 11 is a flowchart of a Source Final Process for an FEC sender.

FIG. 11 illustrates the Source Final Process for FEC sender E. In Step 1105 of FIG. 11 the value of TLAST is initialized to the current time t (which is greater than or equal to T but very close to T depending on the precision of the test in Step 1010 of FIG. 10), and TNEXT is initialized to TLAST+(T−u·T)/(B−S). TNEXT is the time that the next source symbol is scheduled to be sent. In Step 1110 it is checked to see if the current time t is equal to T+T/(1+p), and if so then processing goes to Step 1120, which indicates that the sending of source symbols for the current source block is complete and processing passes on in Step 1120 to the Repair Send Process shown in FIG. 12. If t is not equal to T+T/(1+p) in Step 1110 then in Step 1130 it is checked to see if t is equal to TNEXT. If the test is true in Step 1130 then it is time to send the next source symbol and thus processing passes to Step 1140. In Step 1140 the first received source symbol not yet sent is sent, the number S of sent source symbols is incremented by one, TLAST is updated to the current time t and TNEXT is updated to TLAST+(T+T/(1+p)−TLAST)/(B−S) before processing loops back to Step 1110. If the test is false in Step 1130 then processing loops back to Step 1110 immediately.

Figure 12:
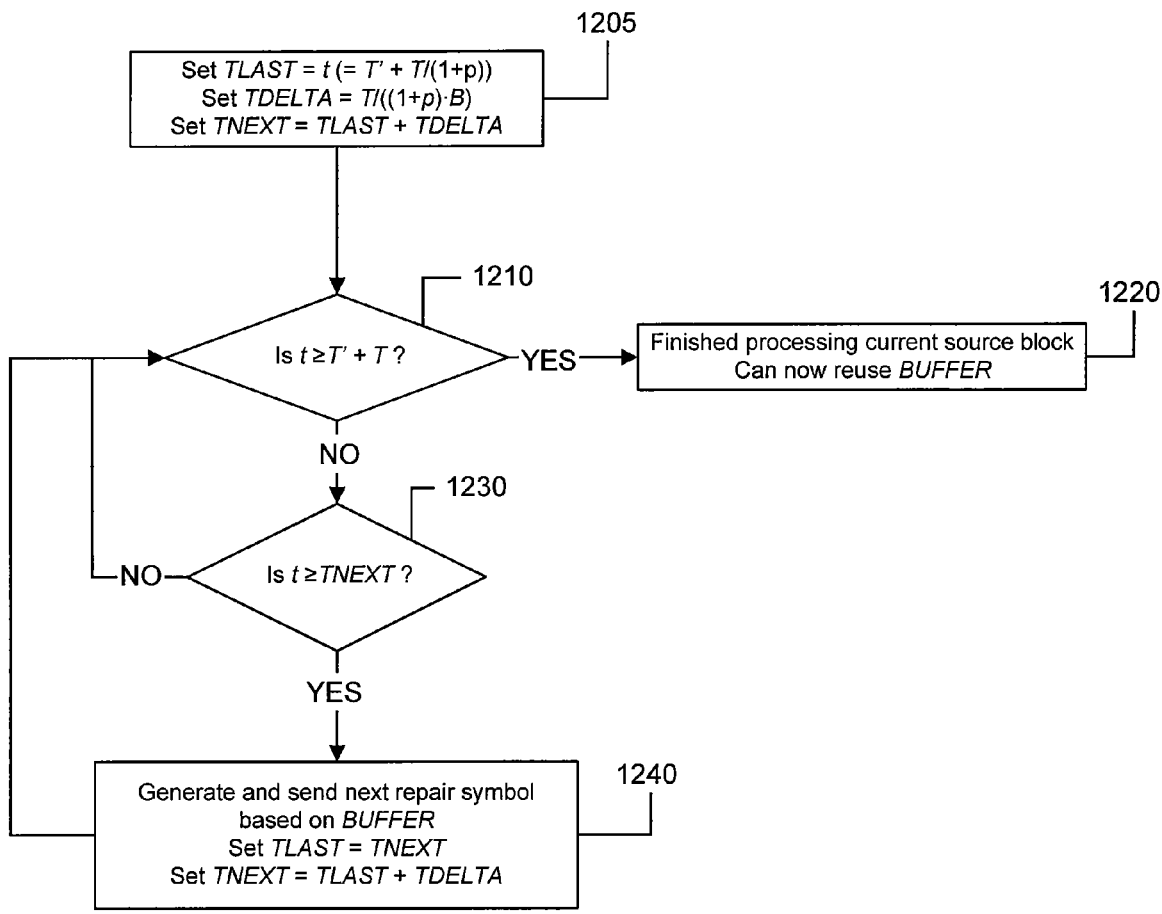
FIG. 12 is a flowchart of a Source Repair Process for an FEC sender.
Figure 13:
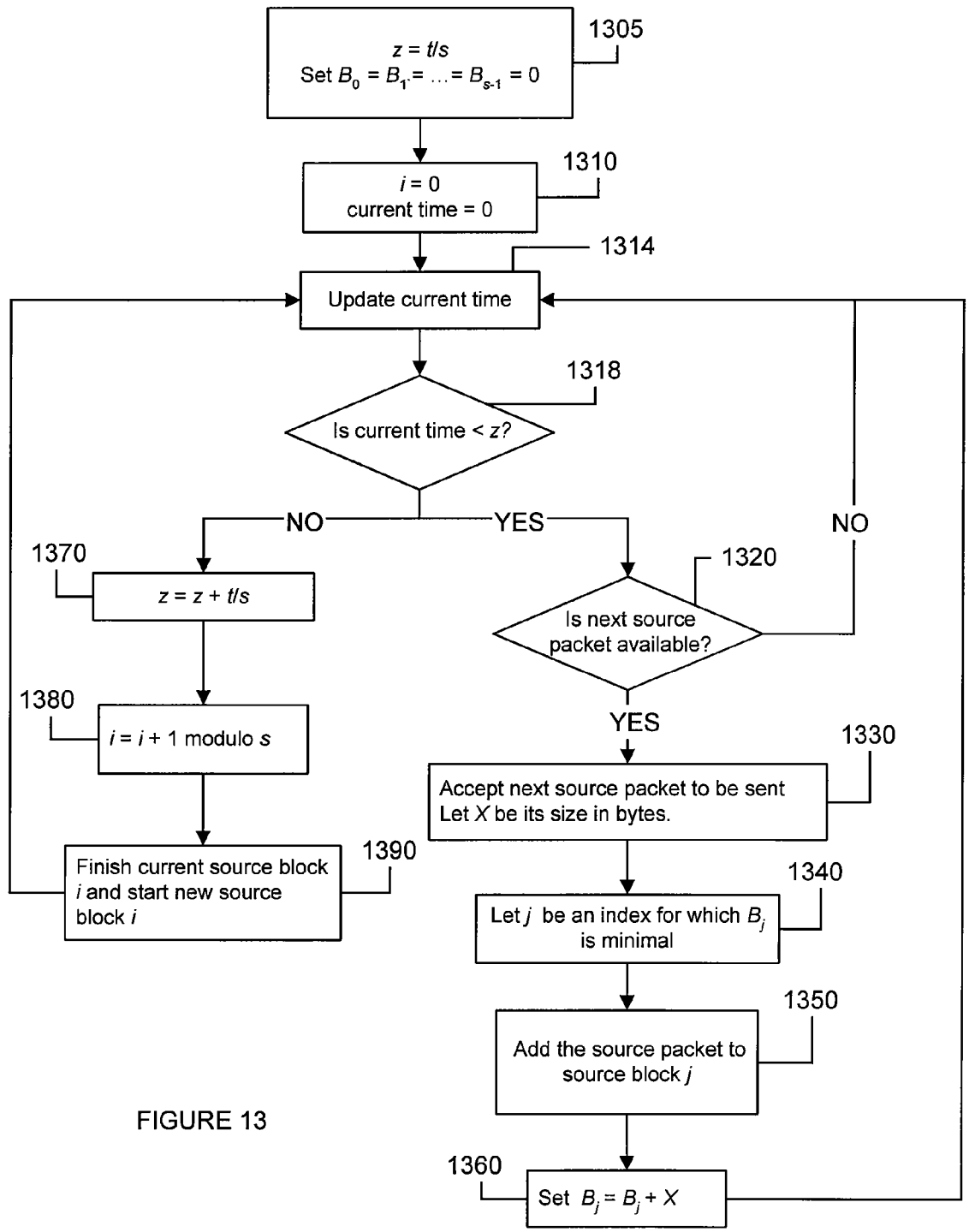
FIG. 13 is a flowchart for an FEC sender.

FIG. 12 illustrates the Repair Send Process for FEC sender E. In Step 1205 of FIG. 12 the value of TLAST is initialized to the current time t (which is greater than or equal to T+T/(1+p) but very close to T+T/(1+p) depending on the precision of the test in Step 1110 of FIG. 11), TDELTA is set to T/((1+p)·B) and TNEXT is initialized to TLAST+TDELTA, where TDELTA is the time increment between each repair symbol and TNEXT is the time that the next repair symbol is scheduled to be sent. In Step 1210 it is checked to see if the current time t is greater than or equal to T+T, and if so then processing goes to Step 1220, which indicates that the sending of repair symbols for the current source block is complete and thus the current source block is complete and thus BUFFER can be reused for subsequent source blocks. If t is less than T+T in Step 1210 then in Step 1230 it is checked to see if t is greater than or equal to TNEXT. If the test is true in Step 1230 then it is time to send the next repair symbol and thus processing passes to Step 1240. In Step 1240 a new repair symbol is generated and sent for the source block based on the source block stored in BUFFER, and TLAST is updated to TNEXT and TNEXT is updated to TLAST+TDELTA before processing loops back to Step 1210. If the test is false in Step 1230 then processing loops back to Step 1210 immediately.

There may be other processes and calculations that occur concurrently with the processes described for FEC sender E. For example, there could be preprocessing of the BUFFER that occurs concurrent with one or more of the four processes in preparation for the generation of repair symbols, and the preprocessed BUFFER could be used as the basis for generating repair symbols in Step 1240 of the Repair Process. There could also be other equivalent processes for accomplishing the same or similar results, e.g., repair symbols may be generated in advance of when they are to be sent instead of being generated just before they are sent as described in Step 1240 of the Repair Process.

Source Block Interleaving

Some FEC codes can efficiently code over a source block of any practical size, and can efficiently work with symbols of any size. However, other FEC codes have practical limitations that make it difficult for them to work efficiently with larger source blocks. This is of particular concern when streaming rates are higher and/or when symbols must necessarily be shorter (for example because of the use of short packets that carry the symbols) and/or when larger protection periods are used.

As an example, Reed-Solomon codes can become impractical when working with a finite field that has more than 256 elements, and working with a finite field of 256 elements limits the number of encoding symbols per source block to 257. In these cases, one solution to the problem is to interleave source blocks, i.e., to send symbols from different source blocks in an intermixed order. Thus, although overall it is desirable to not have any interleaving between source blocks as described in the previous section, for some FEC codes it is useful to allow interleaving in order to use source blocks and number of symbols per source block that are practical for the FEC code while at the same time allowing a protection period for a source block that is longer than the original streaming time for that source block. This section provides some preferred embodiments of FEC senders that interleave source blocks.

In some cases, there may be benefits for allowing the FEC sender to interleave the sending of symbols from different source blocks so that the symbols for each source block can be spread out over a longer protection period than the streaming time for the source block. One reason for doing this is that better protection is provided against time-dependent losses (e.g., bursty loss), i.e., a smaller protection amount is needed to provide protection against a burst loss of a fixed duration as the protection period for a source block grows. While the original streaming time for a source block may be t seconds, the desired protection period for the source block may be p seconds, where p>t. Other desirable properties of a FEC sender that uses interleaving include (1) source packets are sent in their original order, and (2) the time when the last encoding symbol for each subsequent source block is received is as uniformly spread out over time as possible.

The first interleaving property (source packets sent in original order) minimizes latencies introduced at the FEC sender for each type of receiver, and also the use of FEC does not cause significant additional latencies for non-FEC receivers. This also minimizes latencies introduced at the FEC receiver when the receiver tunes-in to the stream, i.e., it minimizes the delay between when a FEC receiver first starts receiving packets until the FEC receiver can safely start making the available.

The second interleaving property (the time when the last encoding symbol for each subsequent source block is received is as uniformly spread out over time as possible) provides for smoother use of the CPU. The time when the last encoding symbol is received for a source block is received is a time when all information for decoding the source block is available to the FEC decoder, and this is typically the time when under worst case loss conditions that the FEC decoder has to work hardest to finish off decoding within the prescribed decoding latency budget. Thus, uniformly spreading out the reception of the last encoding symbol for the source blocks allows smoother use of the CPU for FEC decoding.

In this description, many examples assume that the FEC sender transmits symbols in packets, where each packet may contain a different number of symbols. To simplify the description below, assume that the source packet order in the original source stream is 0, 1, 2, 3, 4, 5, 6, 7, 8, 9, 10, 11, 12, 13, 14, 15, 16, 17, etc., where the value indicates the index of the packet.

Suppose there are s source blocks active at any point in time and k source packets per source block (assume all source packets the same length in this simplified description). The FEC senders below describe how source blocks are formed from source packets and the order in which source packets are sent. The repair packets for a source block can be sent either before, after or intermixed with the source packets for the source block, and as explained herein there are advantages to different strategies.

FEC sender F: The sending pattern repeats each $n=s \cdot k$ packets, where n is the number of source packets in a protection period. Thus, this can be thought of as n source packets in a protection period partitioned into s source blocks of k source packets each. The sending order for source packets is their original sending order. For $i=0, \ldots, s-1$, the i-th source block comprises source packets $i, s+i, 2s+i, \ldots, (k-1) \cdot s+i$. The repair packets for each source block are interleaved in the same order as the source packets, i.e., a first repair packet for each source block is sent before a second repair packet for each source block is sent. An example with 3 source blocks of 6 source packets each (and thus the protection period is 18 source packets in duration) is the following:

Source block 0 comprises source packets 0, 3, 6, 9, 12, 15
Source block 1 comprises source packets 1, 4, 7, 10, 13, 16
Source block 2 comprises source packets 2, 5, 8, 11, 14, 17.

FEC sender F does satisfy the first interleaving property but does not satisfy the second interleaving property. The first interleaving property is satisfied simply because the sending order of the source packets is the original sending order. To see why FEC sender F does not satisfy the second interleaving property, note that consecutive source packets 0, 1, 2 are from source blocks 0, 1, 2, respectively, and thus the decode times for the three source blocks are over consecutive packets, i.e., the decoding time for this interleaving of source blocks is the repeating pattern: "1, 1, 1, 0, 0, 0, 0, 0, 0, 0, 0, 0, 0, 0, 0, 0, 0, 0, 1, 1, 1, 0, 0, 0, 0, 0, 0, 0, 0, 0, 0, 0, 0, 0, 0, 0 . . . ". In this pattern, each entry indicates the reception of a packet, and a 1 indicates that this is the decode time for one of the source blocks. As can be seen from this pattern, the decode times are bursty and not spread out uniformly, and thus from this example it can be seen that FEC sender F does not satisfy the second interleaving property above.

FEC sender G: The sending pattern repeats each $n=s \cdot k$ packets, where n is the number of source packets in a protection period. Thus, this can be thought of as n source packets in a protection period partitioned into s source blocks of k source packets each. The sending order for the source packets is 0, k, 2k, . . . , $(s-1) \cdot k$, 1, k+1, 2k+1, . . . , $(s-1) \cdot k+1$, . . . , k−1, 2k−1, 3k−1, . . . , $s \cdot k-1$. For $i=0, \ldots, s-1$, the i-th source block comprises source packets $k \cdot i, k \cdot i+1, k \cdot i+2, \ldots, k \cdot i+k-1$. The repair packets for each source block are interleaved in the same order as the source packets, i.e., a first repair packet for each source block is sent before a second repair packet for each source block is sent. An example with 3 source blocks of 6 source packets each (and thus the protection period is 18 source packets in duration) is the following:

Source block 0 comprises source packets 0, 1, 2, 3, 4, 5
Source block 1 comprises source packets 6, 7, 8, 9, 10, 11
Source block 2 comprises source packets 12, 13, 14, 15, 16, 17.

The sending order of the source packets is the following: 0, 6, 12, 1, 7, 13, 2, 8, 14, 3, 9, 15, 4, 10, 16, 5, 11, 17.

FEC sender G does not satisfy the first interleaving property but does satisfy the second interleaving property. The first interleaving property is not satisfied simply because the sending order of the source packets is not the original sending order. To see why FEC sender G does satisfy the second interleaving property, note that the decode times for the three source blocks are uniformly spread out over the packets, i.e., the decoding time for this interleaving of source blocks is the repeating pattern: 1, 0, 0, 0, 0, 0, 1, 0, 0, 0, 0, 0, 1, 0, 0, 0, 0, 0 . . . . In this pattern, each entry indicates the reception of a packet, and a 1 indicates that this is the decode time for one of the source blocks. As can be seen from this pattern, the decode times are spread out uniformly, and thus from this example it can be seen that FEC sender G does satisfy the second interleaving property above.

For the following embodiments of interleaved FEC senders that satisfy both the first interleaving property and the second interleaving property simultaneously, we assume that for each individual source block that a preferred embodiment of the single source block FEC senders described in the previous section are used to determine when to send symbols for each source block.

FEC sender H: The sending order for source packets is their original sending order. To describe this FEC sender, the source packets are conceptually placed sequentially into the rows of a matrix with s columns, and then, for $i=0, \ldots, s-1$, column i comprises source packets that have an index that is congruent to any of i, $s+1$, $2s+i$, ..., $(k-1) \cdot s+i$ modulo n.

Source blocks are formed from consecutive sequences of source packets within a column. The first source block of column i starts with the source packet with index i. Each subsequent source block within column i always starts with the source packet with index floor $(k \cdot i/s) \cdot s+i$ mod n, and thus all but the first source block in column i comprises k source packets. The repair packets for each source block are interleaved in the same order as the source packets, i.e., all the repair packets for a given source block in column i are sent before any of the repair packets for a subsequent source block in column i. An example with 3 source blocks of 6 source packets each (and thus the protection period is 18 source packets in duration) is the following:

The matrix described above is:

```
100
000
010
000
001
000
```

Thus, the first source block of column 0 comprises source packets 0, 3, 6, 9, 12, 15, the first source block of column 1 comprises source packets 1, 4 and the second source block of column 1 comprises source packets 7, 10, 13, 16, 19, 22, the first source block of column 2 comprises 2, 5, 8, 11 and the second source block of column 2 comprises source packets 14, 17, 20, 23, 26, 29, etc.

FEC sender H does satisfy both the first interleaving property and the second interleaving property. The first interleaving property is satisfied simply because the sending order of the source packets is the original sending order. To see why FEC sender H does satisfy the second interleaving property, note that the decoding time for this interleaving of source blocks is the repeating pattern: "1, 0, 0, 0, 0, 0, 0, 1, 0, 0, 0, 0, 0, 0, 1, 0, 0, 0". In this pattern, each entry indicates the reception of a source packet, and a 1 indicates that this is the decode time for one of the source blocks. As can be seen from this pattern, the decode times are spread out as uniformly as possible, and thus from this example it can be seen that FEC sender F does satisfy the second interleaving property above.

There are many variants of FEC sender H that satisfy properties (1) and (2) above and can be found after reading this disclosure. For example, FEC sender H as described above works well when all the source packets in the stream are the same size and when the streaming rate of source packets is constant. FEC sender I described below is a variant of FEC sender H that works well when source packets are variable length and/or the streaming rate of source packets is not constant.

FEC sender I: Suppose the desired protection period is t seconds, and that there will be s active source blocks at any point in time. The process is described with reference to FIG. 13. In Step 1305 of FIG. 13, $z=t/s$ is set to be the time increment in seconds between finishing one source block and starting another and the byte counters $B_0, B_1, \ldots, B_{s-1}$ are all initialized to zero. In Step 1310 the variable i is initialized to zero and the current time is initialized to zero, where i will be used to keep track of which source block to finish next and the current time is used to keep track of when to finish a source block. In Step 1314 the current time is updated using a clock at the FEC sender, incremented according to the amount of time passed from the time it was originally set to zero in Step 1310. In Step 1318 is it checked to see if the current time is less than z, and if this is true, processing continues to Step 1320 to see if a next source packet is available. If there is no source packet available then processing returns to Step 1314, but if there is a next source packet available then at Step 1330 the next source packet is accepted and X is its size in bytes. In Step 1340 the index j is calculated such that $B_j$ is minimal. In Step 1350 the just accepted source packet is added to source block j, and in Step 1360 the value of $B_j$ is incremented by the size X of this source packet, and the processing returns to Step 1314. If instead in Step 1318 the current time is at least z then in Step 1370 the value of z is incremented by t/s and in Step 1380 the value of i is incremented by 1 modulo the number s of active source blocks, and in Step 1390 the current source block with index i is finished and a new source block with index i is started, and then processing returns to Step 1314.

As an example of how this process works, suppose $t=6$ seconds and $s=3$, and thus $t/s=2$. Suppose the source packets received within the first two seconds are the following:

Source packet 0 that is 500 bytes in size.
Source packet 1 that is 750 bytes in size.
Source packet 2 that is 400 bytes in size.
Source packet 3 that is 490 bytes in size.
Source packet 4 that is 700 bytes in size.

Suppose also that if there is more than one byte counter with the same minimal value then the byte counter with the smallest index is considered to be smallest. Then, source packet 0 is added to source block 0 and $B_0=500$, source packet 1 is added to source block 1 and $B_1=750$, source packet 2 is added to source block 2 and $B_2=400$, source packet 3 is added to source block 2 and $B_2=890$, source packet 4 is added to source block 0 and $B_0=1200$.

Continuing with the same example, when the current time reaches 2 seconds then source block 1 is finished and contains only source packet 1 of size 750 bytes, and a new source block 1 is started. Suppose that the following describes the sequence of source packet arrivals at the sender in the subsequent two seconds.

Source packet 5 that is 500 bytes in size.
Source packet 6 that is 380 bytes in size.
Source packet 7 that is 400 bytes in size.
Source packet 8 that is 600 bytes in size.
Source packet 9 that is 700 bytes in size.
Source packet 10 that is 400 bytes in size.
Source packet 11 that is 350 bytes in size.
Source packet 12 that is 800 bytes in size.
Source packet 13 that is 200 bytes in size.
Source packet 14 that is 500 bytes in size.

At this point in time, source block 2 is finished and contains in total 2770 bytes of source packets, i.e., source packets 2, 3, 6, 9, 12, and a new source block 2 is started. Suppose that the following sequence of source packets arrive at the sender in the subsequent two seconds.

Source packet 15 that is 350 bytes in size.
Source packet 16 that is 500 bytes in size.
Source packet 17 that is 450 bytes in size.
Source packet 18 that is 800 bytes in size.
Source packet 19 that is 650 bytes in size.
Source packet 20 that is 400 bytes in size.
Source packet 21 that is 600 bytes in size.
Source packet 22 that is 350 bytes in size.
Source packet 23 that is 200 bytes in size.
Source packet 24 that is 600 bytes in size.

At this point in time, source block 0 is finished and contains in total 4150 bytes of source packets, i.e., source packets 0, 4, 7, 10, 13, 14, 17, 20 and 21, and a new source block 0 is started.

FEC sender I has the property that the total number of bytes of source packets allocated to each column is as equal as possible at each point in time, and the decode time for source blocks is spread equally over time at intervals of $z=t/s$. Note that FEC sender I provides essentially the same solution as FEC sender H if the source packet rate is constant and the source packet sizes are all the same. For example, if there are 6 source packets each 2 seconds in the above example and all source packets are 1,000 bytes in size then FEC sender I yields the following matrix:

```
000
010
000
001
000
100
000
010
000
001
000
100
```

Note that in this example the number of source packets in each source block is 6, and that the interleaving pattern is a simple shift of the interleaving example for FEC sender H above.

While the invention has been described with respect to exemplary embodiments, one skilled in the art will recognize that numerous modifications are possible. For example, the processes described herein may be implemented using hardware components, software components, and/or any combination thereof. Thus, although the invention has been described with respect to exemplary embodiments, it will be appreciated that the invention is intended to cover all modifications and equivalents within the scope of the following claims.

What is claimed is:

1. In a data decoder for decoding data from received symbols received over a channel from an encoder, wherein the received data includes erasures and includes source symbols and repair symbols organized into one or more source blocks and wherein the decoder uses a generator matrix in decoding, any square submatrix of which is invertible, such that the decoder performs decoding operations concurrently with the arrival of the source symbols and repair symbols comprising a source block, a method of decoding comprising:
    representing a system of equations in a decoder memory derived, at least in part, from the generator matrix;
    substituting received source symbols into the system of equations as the source symbols are received before receiving all source symbols from the source block;
    identifying, using decoder logic, repair equations to be used for solving the system of equations as repair symbols from the source block arrive;
    calculating, using decoder logic, vector values for equations as source symbols from the source block arrive; and
    converting the system of equations into an upper triangular form as repair symbols from the source block arrive at the decoder.

2. The method of claim 1, wherein the repair symbols of a code are received at the decoder before the source symbols and decoding operations are performed in-place.

3. The method of claim 1, wherein a permutation is applied at the encoder to source symbols before a two-dimensional Reed-Solomon code is applied.

4. The method of claim 3, wherein the permutation is random or pseudorandom.

5. The method of claim 3, wherein the permutation is such that no two adjacent symbols in the original ordering appear in the same row or column of the code.

6. The method of claim 5, wherein the permutation is derived from two permutations $\sigma_1$, $\sigma_2$ such that the symbol s[i,j] in position (i,j) in the source block is mapped through the two permutations such that the symbol s'[i,j] at position (i,j) in the permuted source block satisfies s'[i,j]=s[$(\sigma_1(j)+\sigma_2(i))$ % k,j] where k is the number of rows or columns of the code.

7. The method of claim 1, wherein the generator matrix is a generator matrix for a code that is augmented with more than one repair symbol generated per row of the generator matrix.

8. The method of claim 1, wherein the generator matrix is a generator matrix for a code of the group regular Low-Density Generator Matrix, irregular Low-Density Generator Matrix, regular Low-Density Generator Matrix staircase, irregular Low-Density Generator Matrix staircase, regular Low-Density Generator Matrix triangle, irregular Low-Density Generator Matrix triangle, regular Copper, irregular Copper, or a fountain code.

9. The method of claim 1, wherein the generator matrix is a generator matrix for an error-correcting code.

10. The method of claim 1, wherein the generator matrix is a generator matrix for an error-correcting code and an erasure code.

* * * * *